(12) United States Patent
Liu et al.

(10) Patent No.: US 6,225,212 B1
(45) Date of Patent: May 1, 2001

(54) CORROSION RESISTANT IMAGER

(75) Inventors: Jianqiang Liu, Clifton Park; Ching-Yeu Wei, Niskayuna; Robert Forrest Kwasnick, Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/468,892

(22) Filed: Dec. 22, 1999

Related U.S. Application Data

(62) Division of application No. 08/996,250, filed on Dec. 22, 1997, now Pat. No. 6,037,609
(60) Provisional application No. 60/036,089, filed on Jan. 17, 1997, and provisional application No. 60/036,090, filed on Jan. 17, 1997.

(51) Int. Cl.[7] .............................. H01L 21/44; H01L 29/04
(52) U.S. Cl. .................... 438/625; 438/656; 438/685; 438/149; 257/59
(58) Field of Search ..................... 257/59; 438/30, 438/149, 158, 159, 625, 637, 656, 648, 685, 753, 754

(56) References Cited

U.S. PATENT DOCUMENTS

| | | | |
|---|---|---|---|
| 5,132,745 | 7/1992 | Kwasnick et al. | 357/4 |
| 5,153,754 | 10/1992 | Whetten | 359/59 |
| 5,170,244 | * 12/1992 | Dohjo et al. | 257/72 |
| 5,187,369 | 2/1993 | Kingsley et al. | 250/370.11 |
| 5,191,394 | 3/1993 | Saia et al. | 257/52 |
| 5,198,694 | 3/1993 | Kwasnick et al. | 257/766 |
| 5,212,574 | 5/1993 | Katayama et al. | 359/59 |
| 5,233,181 | 8/1993 | Kwannick et al. | 250/208.1 |
| 5,241,192 | 8/1993 | Possin et al. | 257/59 |
| 5,288,989 | 2/1994 | Ishaque et al. | 250/214.1 |
| 5,318,664 | 6/1994 | Saia et al. | 156/643 |
| 5,340,758 | * 8/1994 | Wei et al. | 438/158 |
| 5,362,660 | 11/1994 | Kwasnick et al. | 437/40 |
| 5,370,972 | 12/1994 | Saia et al. | 430/311 |

(List continued on next page.)

FOREIGN PATENT DOCUMENTS

| | | |
|---|---|---|
| 62-232962 | 10/1987 | (JP) . |
| PCT/US98/00407 | 5/1998 | (WO) . |

*Primary Examiner*—Eddie C. Lee
*Assistant Examiner*—José R. Diaz
(74) *Attorney, Agent, or Firm*—Donald S. Ingraham; Douglas E. Stoner

(57) ABSTRACT

A radiation imager is disclosed that is resistant to degradation due to moisture by either contact pad corrosion, guard ring corrosion or by photodiode leakage. A contact pad of a large area imager is disclosed that is formed into three distinct and electrically connected regions. The resulting structure of the contact pad regions forms reliable contact that is resistant to corrosion damage. Also disclosed is a data line of an imager, or a display, the resistance of which is reduced by patterning an aluminum (Al) line on top of a transistor island structure, with the formed data line preferably being encapsulated. In addition, a guard ring having first and second regions and photosensitive element are disclosed. The second region comprises an electrical contact between ITO and underlying metal and a second tier which acts as a moisture barrier and is preferably disposed at the corner of the guard ring and separated from the contact pads of the imager in such a manner as to minimize corrosion. The photosensitive element has a multitier passivation layer disposed between the top contact layer and an amorphous silicon photosensor island except for a selected contact area on the top surface of the photosensor island, where the top contact layer is in electrical contact with the amorphous silicon material of the photosensor island. The passivation layer includes a first tier inorganic barrier layer which is disposed at least over the sidewalls of the photosensor island.

7 Claims, 12 Drawing Sheets

U.S. PATENT DOCUMENTS

| | | | |
|---|---|---|---|
| 5,384,271 | 1/1995 | Kwasnick et al. | 437/40 |
| 5,389,775 | 2/1995 | Kwasnick et al. | 250/208.1 |
| 5,399,884 | 3/1995 | Wei et al. | 257/59 |
| 5,401,668 | 3/1995 | Kwasnick et al. | 437/3 |
| 5,435,608 | 7/1995 | Wei et al. | 257/59 |
| 5,463,225 | 10/1995 | Kwasnick | 250/370.11 |
| 5,463,242 | 10/1995 | Castleberry | 257/448 |
| 5,480,810 | 1/1996 | Wei et al. | 437/2 |
| 5,489,551 | 2/1996 | Castleberry | 437/173 |
| 5,498,573 | 3/1996 | Whetten | 437/192 |
| 5,516,712 | 5/1996 | Wei et al. | 437/40 |
| 5,517,031 | 5/1996 | Wei et al. | 250/370.08 |
| 5,585,280 | 12/1996 | Kwasnick et al. | 437/4 |
| 5,610,403 | 3/1997 | Kingsley et al. | 250/370.09 |
| 5,610,404 | 3/1997 | Possin | 250/370.09 |
| 5,631,473 | 5/1997 | Possin et al. | 257/59 |
| 5,648,654 | 7/1997 | Possin | 250/208.1 |
| 5,661,050 * | 8/1997 | Boer et al. | 438/30 |
| 5,663,577 | 9/1997 | Kwasnick et al. | 257/59 |
| 5,821,159 * | 10/1998 | Ukita | 438/592 |
| 5,946,547 * | 8/1999 | Kim et al. | 438/30 |
| 6,107,668 * | 8/2000 | Ukita | 257/412 |
| 6,130,443 * | 10/2000 | Hong et al. | 257/59 |
| 6,157,430 * | 12/2000 | Kubota et al. | 349/147 |

\* cited by examiner

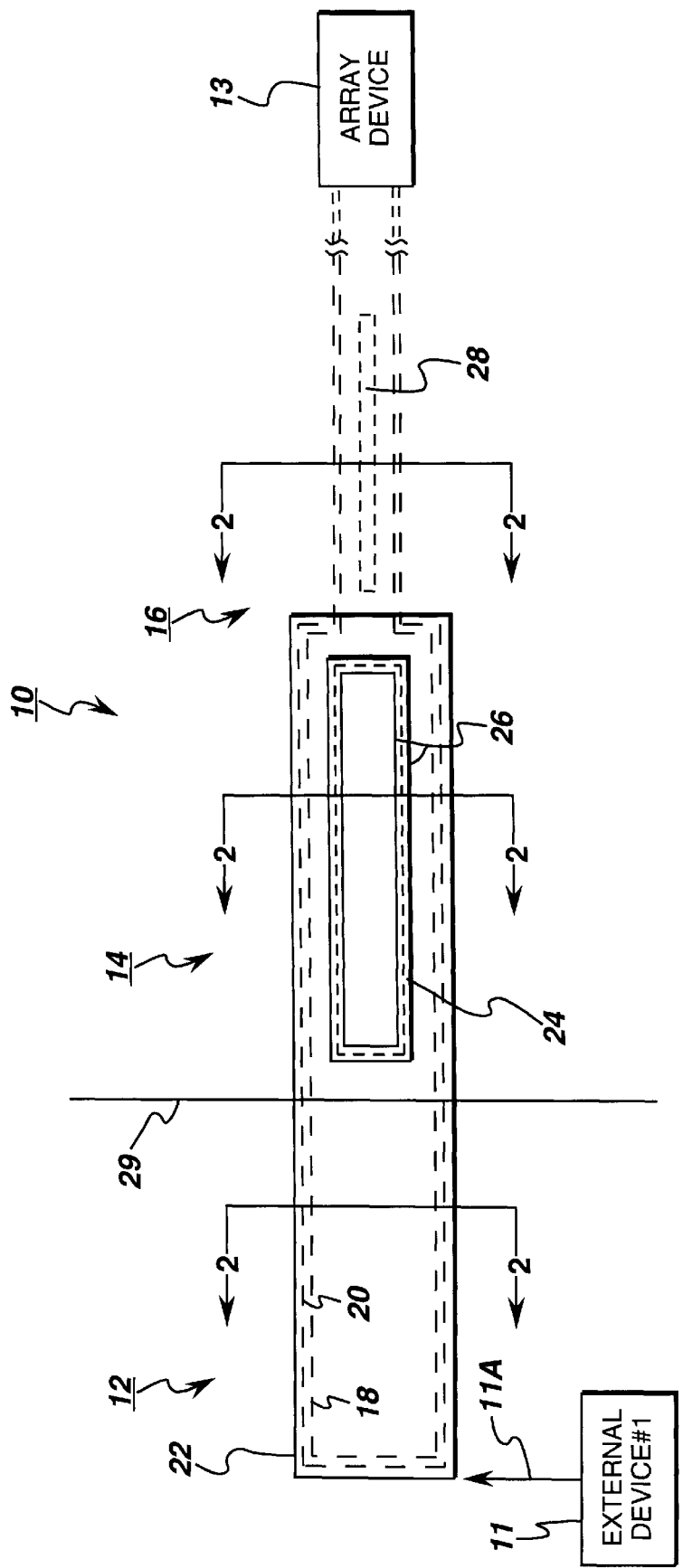

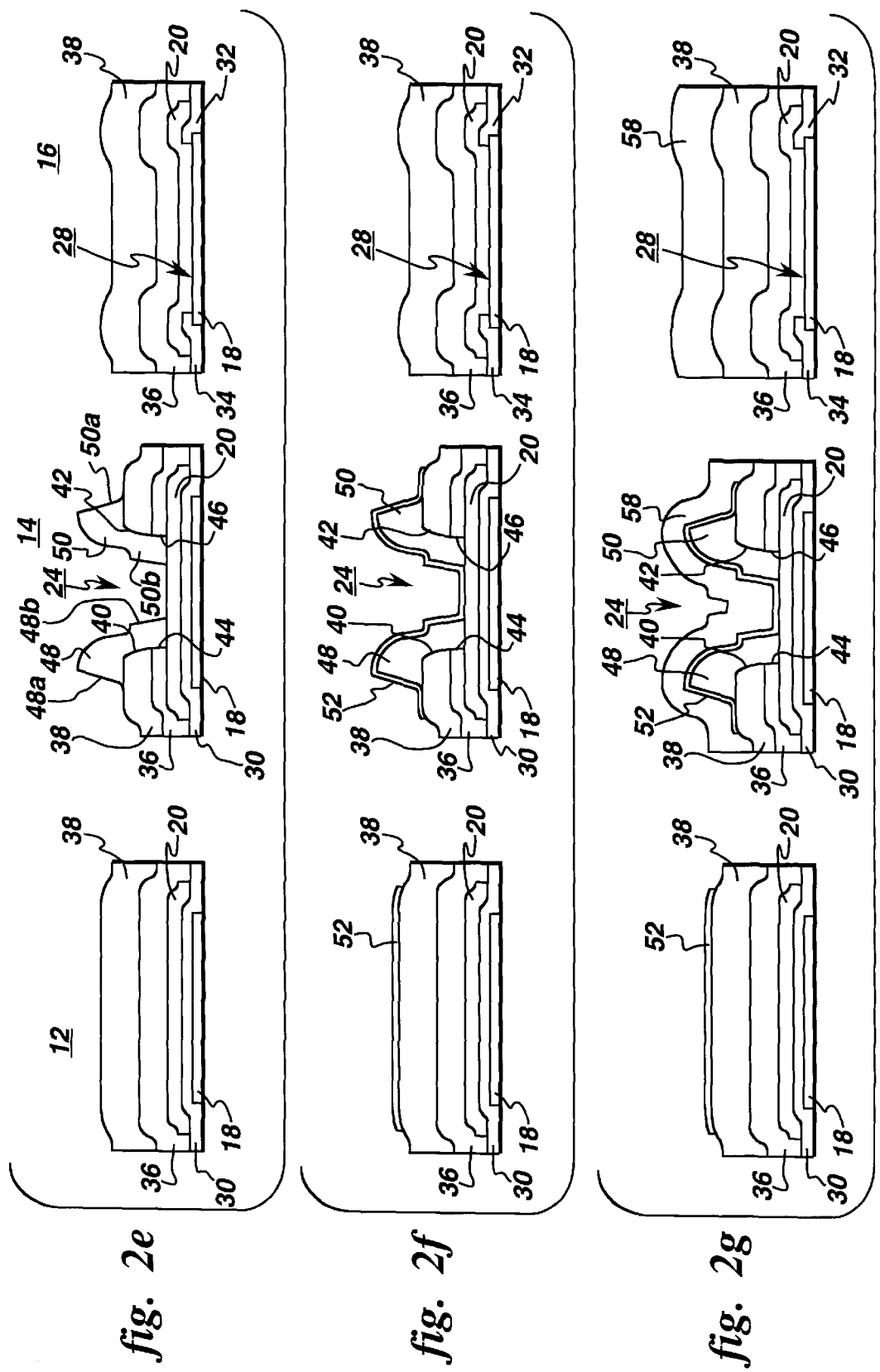

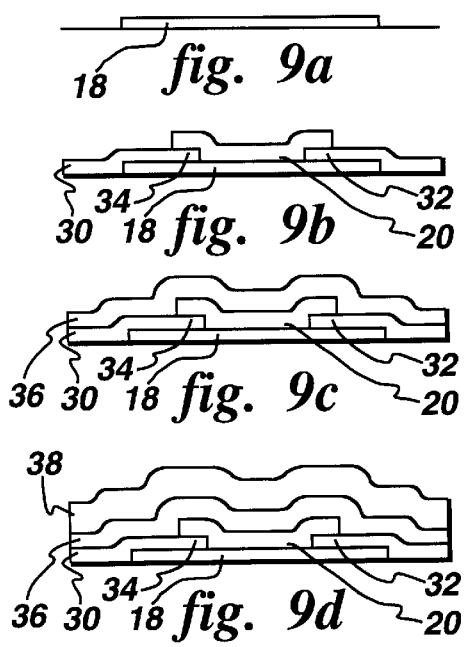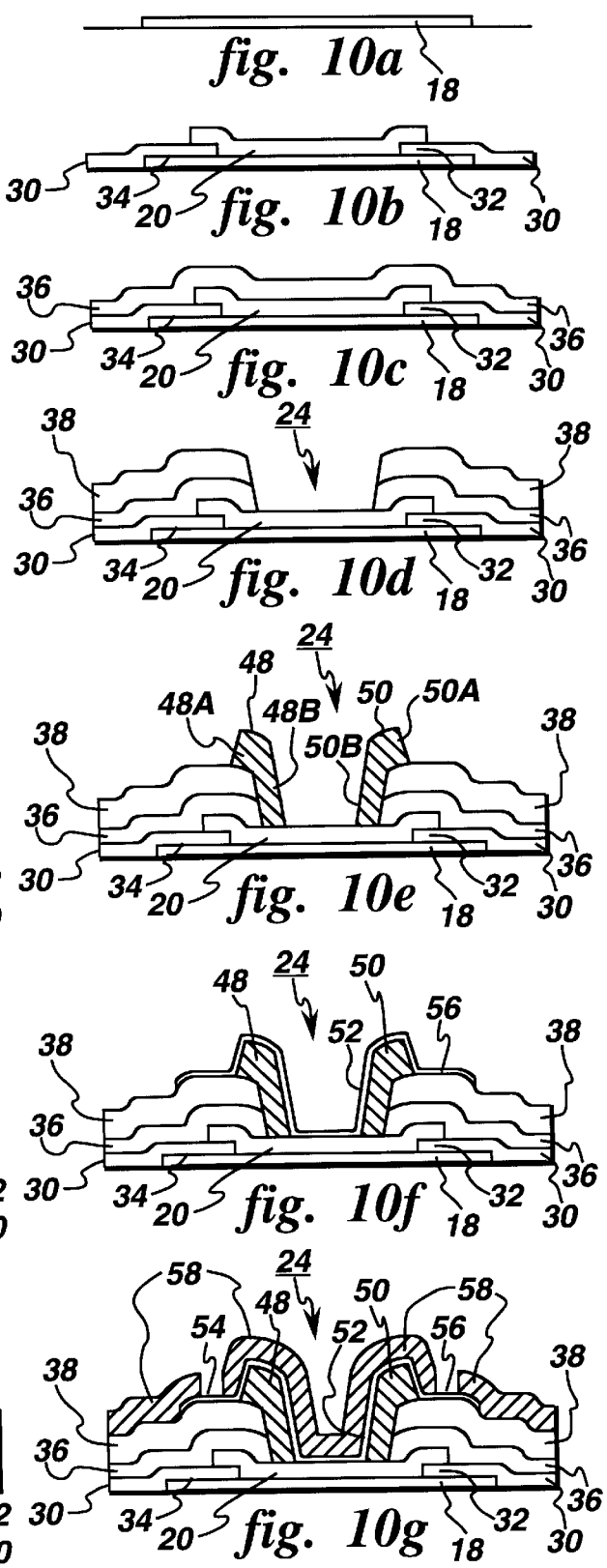

CORROSION RESISTANT IMAGER

This application is a division of application Ser. No. 08/996,250, filed Dec. 22, 1997 now U.S. Pat. No. 6,037,609, which is hereby incorporated by reference in its entirety.

This application claims the priority of Provisional Applications Ser. Nos. 60/036,089 and 60/036,090, all of Liu, Wei, and Kwasnick, and filed Jan. 17, 1997.

This invention was made with U.S. Government support under Government Contract No. MDA972-943-30028 awarded by DAPRA. The U.S. Government has certain rights in this invention.

BACKGROUND OF THE INVENTION

1. Field of the Invention

The field of the invention is imaging or display arrays having photosensor arrays having components embodying hydrogenated amorphous silicon (a-Si) technology, and more particularly, to a contact pad, as well a guard ring, having enhanced corrosion resistance while at the same time providing reliable electrical connections and also being particularly suited for use with an encapsulated data line having reduced electrical resistance. Such arrays may be used for X-ray or light imaging.

2. Discussion of the Prior Art

Imagers and display arrays have contact pads to which electrical contact can be made to external circuitry. Contact fingers connect the contact pads to the edge of the active array area where they electrically connect to scan or data lines or to the common electrode of the array.

The imager is formed on a substantially flat substrate, typically glass. The imager comprises an array of pixels with photosensitive elements, typically photodiodes, each of which has an associated switching element, preferably a thin film transistor (TFT). Both devices (photodiodes and TFTs) preferably comprise a-Si. In operation, the voltage on the scan lines, and hence that of the gates of TFTs of the pixels associated with each scan line, are switched on in turn, allowing the charge on each scanned line's photodiodes to be read out via the data address lines. The scan and data address lines are typically perpendicular to each other. The address line consists of a region in the array. The region outside the array comprises the contact finger, its associated contact pad and then, electrically insulated from the contact pad, a guard ring. The electrical contact to the guard ring is made via its own contact pads which do not electrically connect to the array. The guard ring is usually maintained at ground potential during operation. The guard ring serves the purpose of protecting the array from electrostatic discharge during formation of the imager, and during connection of the imager to external circuitry.

The contact pad is defined by an area of conducting material exposed on the substrate surface on a pad surface. The contact pad region, as used herein, includes the surface contact region and any additional regions with structures that electrically connect the surface pad to the main body of the contact finger. Usually the contact pad is at the end of the contact finger and the guard ring resides outside the contact pad. In some array embodiments, address lines may have two contact fingers and associated contact pads, at opposite sides of the array.

Contact pads consist of a single region TFT gate metal, gate dielectric with vias formed in them, source-drain (S-D) metal regions serving as electrodes, TFT passivation dielectric material typically comprised of silicon oxide (SiOx), a first layer of diode passivation material with a via formed through the two layers (TFT passivation dielectric and diode passivation materials), and a topmost conducting material typically comprising indium tin oxide (ITO) (which also usually forms a substantially transparent common electrode in the photodiode array). The imager includes other materials, such as TFT amorphous silicon (a-Si), photodiode a-Si, an overlaying thin ITO layer on the photodiode, and polymer dielectric, typically a preimidized polyimide (PI) all of which materials are generally removed from the contact pad region. U.S. Pat. No. 5,233,181, assigned to the assignee herein, provides a description for a two layer diode passivation dielectric in which diode passivation layer formed of silicon nitride (SiNx) is removed from the contact pad during formation of the diode top contact via. It has been found that ITO is a good conducting material for use in imagers and display panels because it provides good electrical contact resistance and is particularly suited for use in a contact pad, but it is not a good barrier to moisture allowing possible corrosion of underlying metals.

It is thus desirable in a contact pad for an imager or display panel to use ITO as a conductor, but provide means to retard or even eliminate any corrosion of the contact pad from exposure to ambient moisture. It is further desirable that good electrical contact be maintained by conductive lines extending through vias disposed in passivation layers, such as thick inorganic dielectric materials disposed on the array.

Ground rings, in a manner similar to contact pads, suffer from corrosion when exposed to moisture which degrades the electrostatic protection and electrical function that the ground rings provide, and it is desirable to provide ground rings having means to retard or even eliminate corrosion of the ground rings when exposed to moisture.

The contact fingers, commonly employed in imagers and display arrays, electrically connect to the data lines of the active array. High performance imagers require low noise. Data lines suffer from having unwanted electrical resistance which increase Johnson-related noise during data readout, thereby degrading imager performance; it is thus desirable in an imager array to provide data lines with reduced resistance.

Solid state imaging devices are of particular importance to the present invention and typically include a photosensor coupled to a scintillator. Radiation absorbed in the scintillator (such as x-rays) generates optical photons which in turn pass into a photosensor, such as a photodiode, in which the optical photons are absorbed and an electrical signal corresponding to the incident optical photon flux is generated. The accumulated charge on the respective photosensors provides a measure of the intensity of the incident radiation. Such imaging devices commonly comprise an array of pixels arranged in rows and columns. Each pixel includes a photosensor that is coupled via a switching transistor (typically a TFT or the like) necessitating two separate address lines, a scan line and a data line, and a connection to a common electrode which electrically connects to one surface of all the photodiodes in parallel. In each row of pixels, the readout electrode of the transistor (e.g., the source electrode of the TFT) is coupled to a data line. The photosensor charge from each pixel is read by sequentially enabling rows of pixels (by applying an electrical signal to the contact pad and therefore to the TFT's respective gate electrode which causes the scan line to become conductive), and reading the photosensitive charge from the respective pixels thus enabled via respective data lines coupled to the TFTs.

Amorphous silicon is commonly used in the fabrication of photosensors due to the advantageous photoelectric characteristics of a-Si and the relative ease of fabricating such devices. In particular, photosensitive elements, such as photodiodes, can be formed in connection with necessary control or switching elements, such as TFTs in relatively large area arrays. Environmental conditions can affect the performance of the a-Si components; for example, performance is degraded by exposure to moisture in a manner similar to that discussed with reference to the contact pad and guard ring of the imager, which can be absorbed from humid air in the ambient environment. Moisture absorption in photodiodes undesirably increases the charge leakage from the diode.

Charge leakage is a critical factor in photodiode performance as the loss of charge during a sampling cycle lessens a photodiode's sensitivity and increases the noise. The two significant components of charge leakage are area leakage and sidewall leakage. Particularly in smaller diodes in which the length of the sidewalls is relatively large with respect to the overall area of the photodiode, sidewall leakage constitutes the primary source of leakage, although degradation of sidewall surfaces due to exposure to moisture can make sidewall leakage a significant leakage source in almost any size photodiode.

Multitier passivation layers are commonly made up of inorganic and organic dielectric materials as described in previously cited U.S. Pat. No. 5,233,181. The inorganic part of the diode passivation layer is typically comprised of silicon nitride while the organic passivation layer is commonly made up of polyimide. Most polyimides providing otherwise satisfactory passivation layer characteristics are hygroscopic, that is they tend to absorb some moisture from the environment. A dielectric material such as SiNx should have a high level of structural integrity to provide the desired moisture resistance and electrical insulation. This characteristic is particularly important as defects in the barrier layer disposed on the ITO common electrode can allow moisture penetration which in turn results in electrical leakage from the photodiodes: electrical leakage is an undesirable behavior that can seriously degrade imager performance by introducing electrical noise. The inorganic part of the diode passivation layer is disposed over steep sidewalls of the photosensor diode. Often, the points at which the inorganic part of the diode passivation layer is disposed are high stress areas in which structural degradation can result in moisture penetration and undesired electrical leakage through the diode passivation layer. Thus, structural degradation of the diode passivation layer creates higher electrical noise and a greater number of defective pixels in the imager array.

Although SiNx as the inorganic part of the diode passivation layer in sufficient thickness can provide an effective barrier to moisture penetration, use of SiNx can present processing problems. For example, a thick layer of SiNx is susceptible to cracking (both horizontally and vertically), thereby causing structural degradation and decreased resistance to moisture penetration. Poor adhesion may occur between SiNx and other layers, such as ITO which may be overlaying the photodiode surface or acting as a common electrode, or photoresist. The poor adhesion to photoresist can result in poor dimensional control in processing steps after deposition of the SiNx barrier layer, such as in the formation of vias to provide contact to the photodiodes.

It is thus desirable that an imager array demonstrate both a high degree of moisture resistance and structural robustness to enable effective fabrication and operation of the array in a variety of environments.

SUMMARY OF THE INVENTION

The present invention is directed to a high performance solid state radiation imager having low noise components for addressing pixels in the array.

In one embodiment of the present invention, an imager comprises a contact pad that is particularly suited to connect to a contact finger which, in turn, connects to scan and data lines for addressing pixels of the imager. The contact pad comprises first, second and third regions, each having a continuous gate contact region which is overlayed by a continuous source-drain contact region. The first and second regions further comprise a continuous conductor comprising indium tin oxide (ITO) which overlays the source-drain contact region.

In another embodiment, the imager comprises a low noise data address line comprising an aluminum line deposited on a field effect transistor structure. The data line is preferably completely encapsulated by source-drain electrode material comprised of a molybdenum layer. The encapsulation confines the grain boundary motion and minimizes exposure in subsequent processing steps of the aluminum layer, thereby reducing the detrimental effects of array fabrication steps on aluminum in the data line while retaining the benefit of use of aluminum material to reduce the electrical resistance of the data line.

In a further embodiment, the imager comprises a guard ring that is typically maintained at a ground potential. The guard ring typically forms a boundary region serving as a perimeter in the region more distant from the array than the contact pads with at least one corner and with one or more guard ring contact pads abutting the perimeter. The guard ring has first and second regions each having a continuous gate contact region overlayed by a continuous source-drain contact region which, in turn, is overlayed by a continuous conductor comprising ITO having upper and lower surfaces and wherein the ITO conductor in the first region has its lower surface disposed from the continuous gate contact by at least one dielectric layer. The ITO conductor in the second region makes contact with the continuous source-drain contact region, and a majority of the ITO conductor in the first and second regions is overlayed by a barrier layer. One of the first and second regions has a portion of the ITO conductor free of the barrier layer and extending so as to electrically connect to one or more guard ring contact pads.

In a still further embodiment, a solid state imaging device comprises a photosensor array disposed on a substrate, the array including a plurality of individually-addressable pixels. Each pixel includes a photosensor and a TFT coupled thereto so as to selectively electrically couple the photosensor to an address line when a voltage is applied to a gate electrode in the TFT. In accordance with an exemplary embodiment of this invention, the photosensor includes a bottom contact pad disposed on a substrate, a photosensor island disposed on the substrate in electrical contact with the bottom contact pad, a multitier passivation layer, and a top contact layer. The photosensor island has sidewalls extending from a base of the photosensor island upwardly to an upper surface extending between the sidewalls. The top contact layer is in electrical contact with a contact area typically comprising an inner portion of the upper surface of the photosensor island; elsewhere the multitier passivation layer is disposed between the top contact layer and the underlying photosensor island and substrate. The multitier passivation layer includes at least a first tier inorganic barrier layer and a second tier inorganic barrier layer, the multitier passivation layer extending over at least the photosensor island sidewalls.

The first tier inorganic passivation layer is typically comprised of silicon oxide. This passivation layer is disposed at least over the sidewalls of the photosensor island to provide enhanced adhesion to the underlying diode surface. The second tier inorganic passivation layer is a moisture barrier that typically comprises silicon nitride and is disposed on the first tier inorganic passivation layer. In other embodiments, a third tier inorganic passivation layer of silicon oxide is incorporated so as to improve adhesion to the photoresist used to pattern the inorganic part of the passivation layer. In a further embodiment, a passivation layer comprises the second and third tiers comprising silicon nitride and silicon oxide.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which like characters represent like parts throughout the drawings, and in which:

FIG. 1 is a top view schematic representation of the contact pad of the present invention having first, second and third distinct electrical regions.

FIGS. 9 and 10 are cross-section views related to the process associated with the imager of FIG. 7.

DETAILED DESCRIPTION OF THE PREFERRED EMBODIMENTS

Figure 2A:
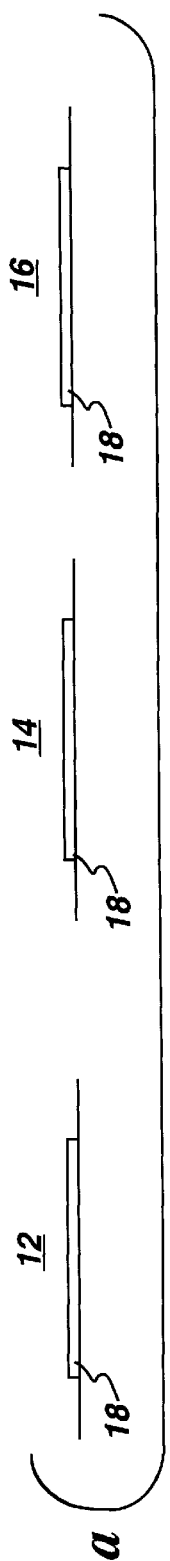
FIG. 2 is composed of FIGS. 2(a), 2(b), 2(c), 2(d), 2(e), 2(f) and 2(g) that illustrate a preferred method of forming the contact pad of FIG. 1.

Referring to the drawings, FIG. 1 is a top view schematic illustration of a contact pad 10 having a first region 12, a second region 14, and a third region 16. The first, second and third regions 12, 14 and 16, respectively each have a continuous gate contact region 18 (shown in phantom) which is overlayed by a continuous source-drain contact region 20 (also shown in phantom). As used herein, "overlayed" and the like refer to relative positions of materials and components in the imager array (e.g., one material deposited over another, with or without intervening material layers) and does not connote any limitation on orientation or use of the imager array. The first and second regions 12 and 14 further comprise a continuous conductor 22 that typically comprises indium tin oxide (ITO) and which overlays the source-drain contact region 20. A portion of the gate contact region 18 in the second region 14 includes a first via 24 (shown in phantom) in the inorganic part of a diode passivation layer, to be further described with reference to FIG. 2, which is surrounded by a rectangular polyimide annular arrangement 26. The third region 16 preferably includes a second via 28 (also shown in phantom) in the TFT gate dielectric over the gate contact region 18, to be further described with reference to FIG. 2. The contact pad 10 further includes a barrier layer (not shown in FIG. 1 but to be described with reference to FIG. 2) having an edge 29. The barrier layer covers the regions of the contact pads to the right of edge 29 as viewed in FIG. 1.

The first region 12, in operation, is connected to an external device 11, more particularly, to a flexible connector 11A from the external device 11. The third region 16 serves as a means for connecting to an array device 13. More particularly, one, or alternatively, both the gate contact region 18 and source-drain contact region 20 are continued (indicated by broken lines) so as to run to and electrically connect to the array device 13, which may be an imaging array, display array, or the like.

In the practice of the present invention it has been found that of the conducting materials used in imager or display array fabrication, use of indium tin oxide (ITO) is desirably in many respects in that it is robust with regard to maintaining low electrical contact resistance and experiencing minimum corrosion over long term exposure to moisture. As used herein, long term exposure is meant to represent weeks to years and the long term exposure is mimicked by testing the imagers and display panels, related to the present invention, under conditions of high temperature and relative humidity, e.g., 85° C. and 85% relative humidity for the periods of days to weeks.

Further, in the practice of the present invention it has been found that a thin layer of ITO (e.g., having a thickness on the order of 0.1 μm) that does not have of the benefits of the present invention and that is used in imager or display array fabrication, is insufficient to protect underlaying conducting material from corrosion by exposure to moisture. The present invention is adapted to the use ITO as its transparent electrically conducting material; additionally, other related compounds are contemplated by the practice of the present invention. The contact pad of FIG. 1 that utilizes ITO as an electrically conducting material, but does not suffer prior art disadvantages, may be further described with reference to FIG. 2 which is composed of views taken along lines 2—2 shown in FIG. 1 located in the first, second and third regions 12, 14 and 16 respectively.

FIG. 2 is composed of FIGS. 2(a)–2(g) illustrating steps involved in the formation of the contact pad of FIG. 1, particularly suited for an imager. As used herein, the usage of the term "formation" includes depositing of a material and, where applicable, patterning array components by the removal of all or selected portions of the deposited material. The method of FIG. 2 is concerned with the fabrication of first, second and third regions 12, 14 and 16, respectively, shown in FIG. 1 and also in FIG. 2. More particularly, FIG. 2 is segmented into the first, second and third regions 12, 14 and 16 so as to more clearly illustrate the formation of each of the illustrated regions.

FIG. 2(a) illustrates the formation of the continuous gate contact region 18, respectively, for an imager. The forming of gate contact region 18, as well as the forming of other metal contact regions or non-metal regions of FIG. 2, may be accomplished in a manner known in the art, such as evaporation and sputtering of metals such as Mo, Cr, Ta, Ti, Al, or combinations thereof.

Figure 2B:
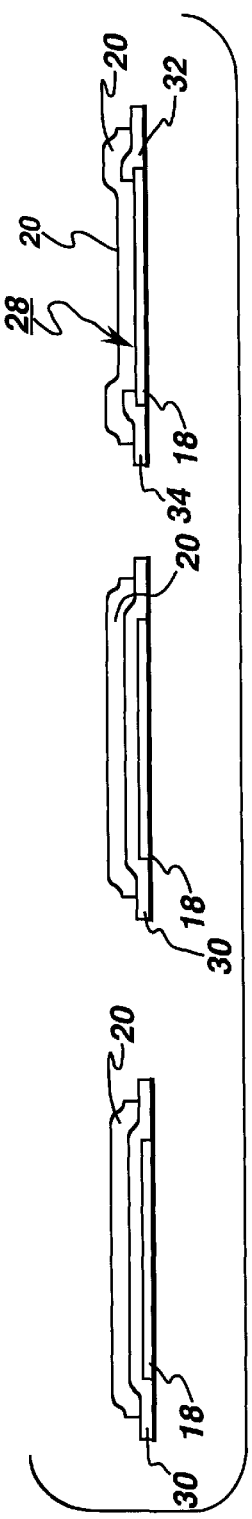

FIG. 2(b) illustrates the formation of a first dielectric layer 30 over the gate contact region 18, but in addition thereto FIG. 2(b), with reference to region 16, depicts that the dielectric layer 30 has been removed from a region of the gate contact region 18 but leaving the dielectric layer at the edge portions 32 and 34 of the gate contact region 18. The first dielectric layer 30 is often called the gate or TFT dielectric layer. The removal of the first dielectric layer 30 provides the via 28, previously mentioned with reference to FIG. 1 and commonly referred to as a FET digdown via, that allows for the source-drain contact region 20 to make good electrical contact with the gate contact region 18. Further details in which vias, such as via 28, are formed are to be more fully described hereinafter with reference to FIG. 6(c). The first dielectric layer 30 is removed from the gate contact region 18 by appropriate means, such as by conventional wet-etching in a solution comprising hydrofluoric acid. The first dielectric layer 30 of FIG. 2(b) and edge portions 32 and 34 have a typical thickness from about 0.1 $\mu$m to about 0.5 $\mu$m comprising silicon nitride SiNx or silicon oxide SiOx and are typically deposited by plasma enhanced chemical vapor deposition (PECVD).

FIG. 2(b) further illustrates the formation of the continuous source-drain contact region 20 onto the dielectric layer 30 of the first and second regions 12 and 14, onto the central part of the gate contact region 18 in the third region 16 and overlapping onto the edge portions defined by the edge portions 32 and 34 of the first dielectric layer 30. The source-drain contact region 20 preferably is comprised of molybdenum which is patterned by appropriate means, such as wet-etching in a solution available from Cyantek, Inc., carrying the tradename "Cyantek 12S." The molybdenum has a thickness in the range from about 0.1 $\mu$m to about 1.0 $\mu$m.

Figure 2C:
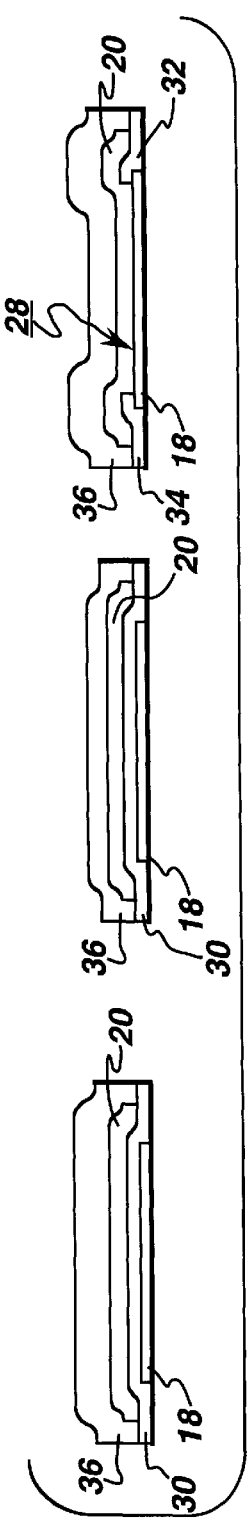

FIG. 2(c) illustrates the formation of a TFT passivation layer 36 over the source-drain contact region 20. The TFT passivation layer 36 may be of a material selected from the group comprising SiNx and SiOx and have a thickness in the range from about 0.1 $\mu$m to about 1.0 $\mu$m.

It has been found that these FET digdown vias 28 of FIGS. 2(b) and 2(c), having steps, can be the cause of excessive wet etching under the patterning photoresist of the first or diode digdown vias 24, to be described with reference to FIG. 2(d), along the steps of the second or FET digdown via 28. Additionally, it has been found that the steps of the FET digdown vias 28 can lead to other problems such as degrading the adhesion of layers overlaying the TFT dielectric layer 36 due to the additional topography. In the practice of the invention, in order to provide for a reliable electrical contact, the FET digdown vias 28 were only formed in the third region 16. Additional embodiments of the present invention addressed to reduce the adhesion difficulties of dielectric layers are to be further described with reference to FIGS. 11–13.

Figure 2D:
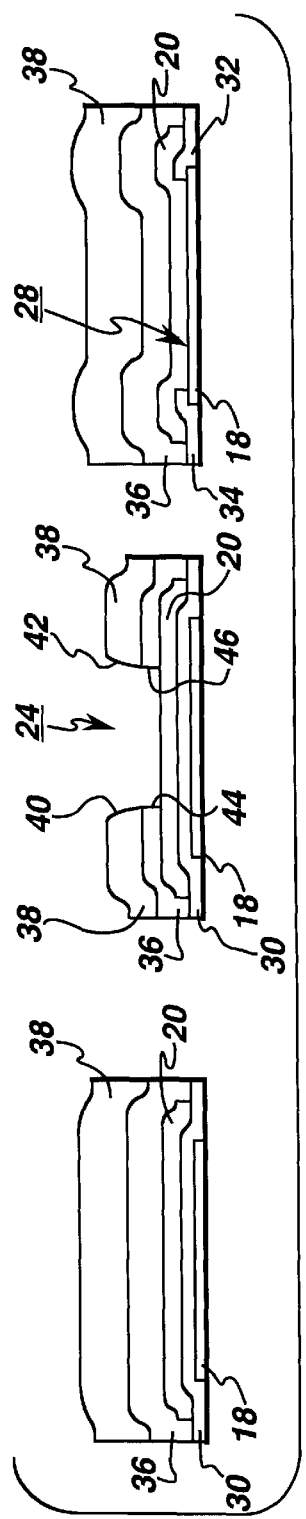

FIG. 2(d) illustrates the formation of a diode passivation layer 38 over the TFT passivation layers 36, except in region 14 which shows that the TFT and diode passivation layers 36 and 38 respectively have been removed from a predetermined central area corresponding to the second (or diode) digdown via 24 also shown in FIG. 1 in such a manner so as to expose the central region of the source-drain contact region 20 and to leave portions 40 and 42 in the remaining diode passivation layer 38. Layers 36 and 38 are etched in the same patterning step.

The diode passivation layer 38 in one embodiment comprises silicon nitride having a thickness in the range between about 0.5 microns to about 1.5 microns. The diode passivation layer 38, in a preferred embodiment, comprises a three layer structure consisting of an underlying material of SiOx having a thickness of about 20 nm to about 50 nm, an intermediate layer of SiNx having a thickness of about 0.5 $\mu$m to about 1.5 $\mu$m, and a topmost layer of SiOx having a thickness of about 20 nm to about 50 nm. The intermediate layer SiNx acts as a moisture barrier while the underlying and topmost SiOx layers have been found to enhance adhesion of the three layer diode passivation layer to its contacting elements, such as shown in FIG. 2. Further advantages of a multilevel, multitier passivation layer are to be further described hereinafter with reference to the embodiment of FIGS. 11, 12 and 13.

The three layer structure of the diode passivation layer 38 and the underlying TFT passivation layer 36 in region 14 may be dry etched, wet etched or etched by a combination of timed wet etch followed by timed dry etch. The dry etching may be selected from the processes comprising the group of plasma, barrel or reactive ion etching incorporating Flourine, Chlorine, or a combination thereof.

FIG. 2(e), in particular region 14, illustrates the formation of a polymer coating comprised of oppositely located first coating portion 48 and second coating portion 50 positioned to overlap via edge portions 40, 42, 44, and 46. The polymer coating typically comprises a preimidized polyimide (Pl) having a trade name of "OCG Probromide 286" made available by Olin Ciba-Geigy and having a thickness from about 1.0 $\mu$m to about 2.0 $\mu$m deposited by a spin or a meniscus coating process. It is preferred that the preimidized polyimide (Pl) be formed into a rectangular arrangement 26, previously mentioned with reference to FIG. 1, (yielding opposite first and second portions 48 and 50 in cross-section respectively having sloped sidewalls 48A and 48B; and 50A and 50B as shown in FIG. 2(e)), the inside of which helps define the electrical contact between the ITO layer and source-drain contact region 20 to be further described with reference to FIG. 2(f), in particular, in region 14 thereof. The Pl is dry-etched in a plasma comprising $O_2$ to pattern the coating to form sloped sidewalls 48A, 48B, 50A and 50B, having slopes in the range of about 30° to about 60° with respect to the upper surface of source-drain contact region 20.

FIG. 2(f) illustrates the formation of a layer 52 of ITO in region 12 over the diode passivation layer 38 therein and also over the remaining exposed central region 24 (diode digdown via) of the source-drain contact region 20 in the second region 14 and also over the preimidized polyimide portions 48 and 50, as well as some of the diode passivation layer 38 of the second region 14. The layer 52 is preferably formed by evaporation or sputtering and has a thickness of about 50 to about 200 nanometers. The ITO typically is wet-etched in a solution comprising hydrochloric acid.

The ITO layer 52 is the top most layer in the first region 12 in order to be allowed, by appropriate means, to make contact with the flexible connector 11A of equipment 11 shown in FIG. 1. To minimize the chance of corrosion, the layer of ITO 52 is vertically isolated from underlying conductive materials, such as gate contact region 18 and source-drain contact region 20 by dielectric layers, that is, preferably by the TFT passivation layer 36 and the diode passivation layer 38.

The preimidized polyimide portions 48 and 50 having sloped sidewalls 48A and 48B; and 50A and 50B respectively, described with reference to FIG. 2(e) of region 14, help define the contact between the ITO layer 52 and source-drain contact region 20. The inside and outside edges, corresponding to the sloped sidewalls 48A and 48B;

and 50A and 50B, of the preimidized polyimide portions 48 and 58, formed into a rectangular arrangement 26 discussed with reference to FIG. 2(e) and shown in FIG. 1, enclose the sidewalls (40 and 42) formed in the diode passivation layer 38 and the sidewalls (44 and 46) of the TFT passivation dielectric layer 36, thereby, smoothing the profile at that sidewall for the ITO layer 52 so that the ITO layer 52 is highly reliably electrically continuously across the step formed in the via 24. Because the sidewalls 44 and 46 are sealed by the polyimide (preimidized polyimide portions 48 and 50), their exact sidewall slopes are not critical, which eases greatly a difficult task of forming smoothly and uniformly sloped sidewalls over a relatively large area. More particularly, a typical imager with an active area greater than 10 cm by 10 cm may have over a thousand contact pads, each requiring sealing which would otherwise present a difficult formation problem except for the benefits of the present invention.

FIG. 2(g) illustrates the formation of a barrier layer 58 covering the second and third regions 14 and 16 respectively. As previously mentioned, the barrier layer 58 covers all of the contact pad 10 to the right of the barrier edge 29 as viewed in FIG. 1. The barrier layer 58 may have a thickness of about 0.5 to about 2.0 microns and is comprised of a material selected from the group comprising SiNx and SiOx and combinations thereof. The barrier layer 58 may be deposited by a plasma etched chemical vapor deposition process. The barrier 58 in region 14 seals the edges of the steps of the structure, e.g., the gate contact region 18 therein and the source-drain contact region 20 therein that are distant from the array, that is, the radiation array related to the present invention, because the edge portions of the elements 18 and 20 are the most susceptible to moisture permeation and to being attacked during etching that is performed after the steps (related to elements 18 and 20) are formed. Similarly, the layer 52 of ITO in the second region 14 extends laterally past the edges of the gate contact region 18 therein and source-drain contact region 20 therein and therefore is desired to be and is sealed by the barrier layer 58.

Further, the barrier layer 58 placed in region 14 provides sealing which is beneficial because of the susceptibility of the preimidized polyimide absorbing some moisture, and because region 14 may lay outside a protective ring of material (not shown) that encloses the active area of an imager or display array related to the present invention.

In the practice of the present invention it has been found that it is desirable for the bottom layer of the diode passivation layer 38 to preferably have a thickness of about 1 micron, with thicknesses in the range of 0.5 to about 2.0 microns thick acceptable, in order to best protect the photodiodes of an associated array, known in the art, from moisture. Without such protection, the photodiodes may leak under reverse bias with exposure to high humidity, possibly compromising the usefulness of an imager related to the present invention.

To overcome such detrimental reverse bias leakage, it has been found that a layer of approximately 0.1 micrometers of ITO does not make reliable contact to the underlying conductive material, usually source-drain contact region 20. This unreliable contact occurs at the edge of the diode digdown via, such as the via 24 of FIG. 1. This unreliable contact pad diode digdown via also includes about 0.5 microns of the TFT passivation material 36. Accordingly, and in a manner more fully discussed hereinbefore with reference to FIGS. 2(e) and 2(f), in the practice of the present invention the preimidized polyimide portions 48 and 50 advantageously help define the contact between the indium tin oxide layer 52 and the source-drain contact region 20 so as to provide a highly reliable contact therebetween.

It should now be appreciated that the practice of the present invention provides for a contact pad having three distinctive electrically connected regions. In one application related to an imager, an external device 11 of FIG. 1 is connected to the outermost contact pad region 12 having the ITO layer exposed but with a thick layer of dielectric between it and the underlying conductive layers, such as 18 and 20 of FIG. 2(g). As used herein, "exposed" and the like refers to a portion of the material being exposed to the ambient environment surrounding the pixel array, the array itself, however, may be disposed in an enclosure such that the ambient environment immediately surrounding the array is within such enclosure. In the region 14, the ITO layer 52 of FIG. 2(g) makes contact to underlying source-drain contact region 20 by transversing the outer and inner portions of preimidized polyimide portions 48 and 50. In the region closest to the array, that is, the region 16, the source-drain contact region 20 is in contact with the gate contact region 18 of the thin film transistors. The regions 14 and 16 are covered by a barrier dielectric layer 58 as illustrated in FIG. 1 with regard to edge 29. The resulting structure of the contact pad 10 of FIG. 1 forms reliable contact, while allowing the formation of an imager that is highly resistant to degradation due to moisture by either contact pad corrosion or photodiode leakage.

Another embodiment of a high performance imager comprises an address line, more particularly, a data line the resistance of which is reduced by patterning an aluminum line on top of a FET structure, with the formed data line preferably being encapsulated and which data line may be further described with reference to FIGS. 3–6 that illustrate a preferred method of forming the data line.

The practice of the present invention incorporates aluminum into data lines that are commonly interconnected throughout imagers and display arrays in a manner known in the art. The aluminum data lines of the present invention are advantageous because of their low resistance which reduces the imager electronic noise related to data line resistance and also because of the minimum additional depositions and photolithographic pattern steps of the present invention, the advantages of the use of an aluminum material for a data line are more fully realized.

Aluminum is known to have excessive grain boundary movements upon being exposed to temperatures typically used in imager fabrication processes, i.e., 200° C. to 250° C. This grain boundary movement may disadvantageously lead to the growth of aluminum hillocks on the order of 1 micron which, in turn, may readily cause shorts between the aluminum material and other layers in the imagers and/or display arrays.

It is further known that in the formation of source-drain metals, some of which have been previously discussed with reference to FIGS. 1 and 2, it is a complication to wet etch molybdenum, comprising the source-drain metal, at an elevated temperature because the molybdenum wet etch rate increases with temperature, and the effective process control of the length of source-drain metal is more difficult to maintain, especially if the molybdenum is relatively thin, that is, 200 nm or less in thickness due to the short etch time. Further, if aluminum is present in the process, in order to avoid a differential etch rate between the aluminum and the molybdenum, which would lead to undercut of one of these layers relative to the other, both materials need to be etched at about 55° C. where the molybdenum rate is about 7000 angstroms per minute. The etching may be accomplished by using a solution carrying the tradename "Cyantek-12S" made available from Cyantek, Inc., and acceptable performance thereof can be achieved from about 40° C. to about 60° C. The temperature of 55° C. is preferred and taken into account in the practice of the present invention. The present invention forms the data lines comprising an aluminum layer and may be further described with reference to FIGS. 3–6, wherein FIGS. 3, 4, 5 and 6 are respectively comprised of FIGS. 3(a), 3(b); 4(a) and 4(b); 5(a) and 5(b); and 6(a), 6(b) and 6(c).

Figure 3A:
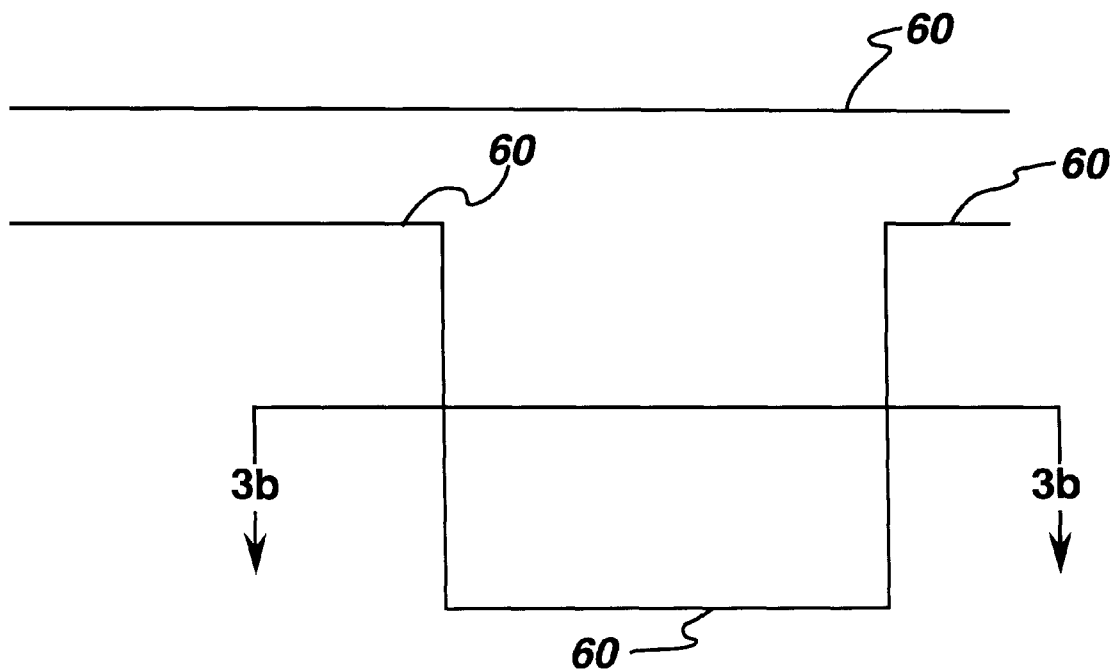
FIGS. 3–6 illustrate the sequence of steps of the preferred method for forming the data line also related to the present invention having reduced electrical resistance.
Figure 3B:
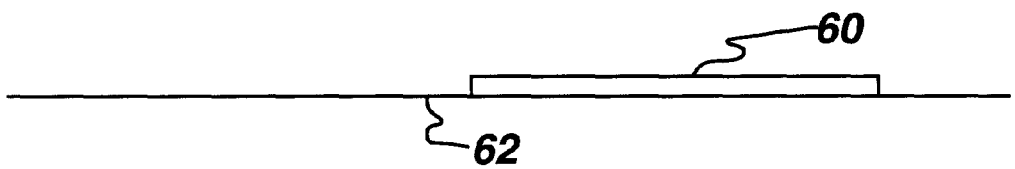

FIG. 3(a) illustrates a gate electrode 60 (extending as a finger from a scan line in the pixel array); FIG. 3(b) is a cross-sectional view taken along line 3(b)—3(b) of FIG. 3(a) that illustrates that the gate electrode 60 is formed on a substrate 62. The formation of the gate electrode 60, as well as other materials shown in FIGS. 4–6, is accomplished in a manner known in the art and described hereinbefore.

Figure 4A:
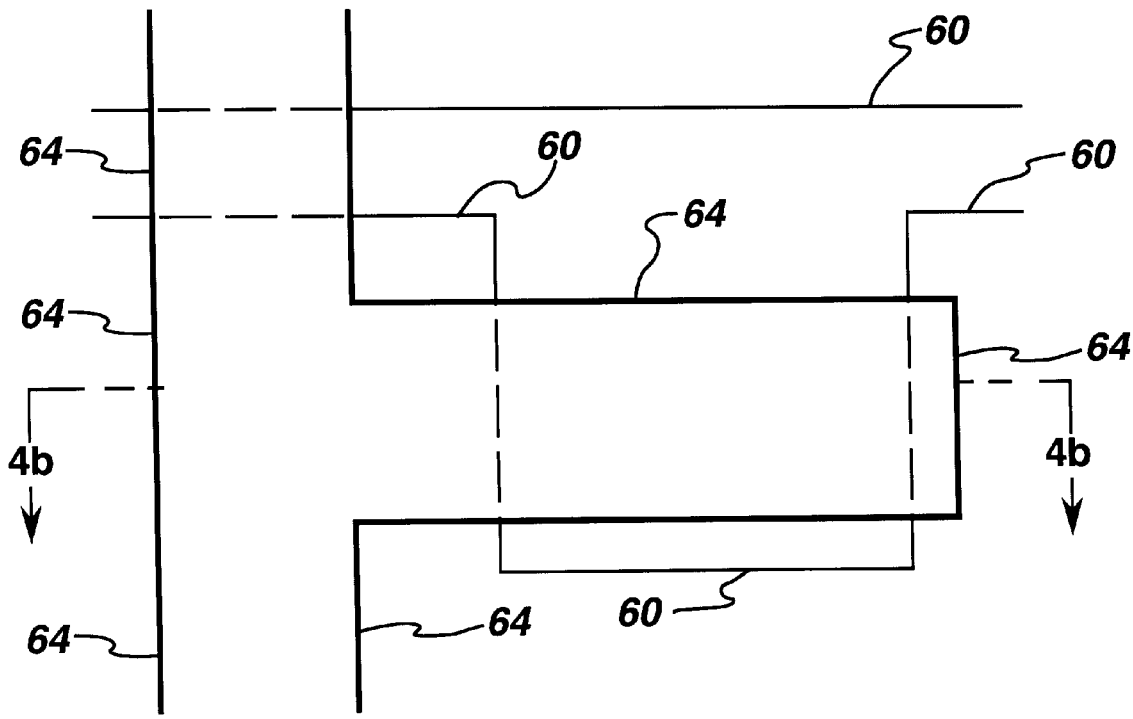
Figure 4B:
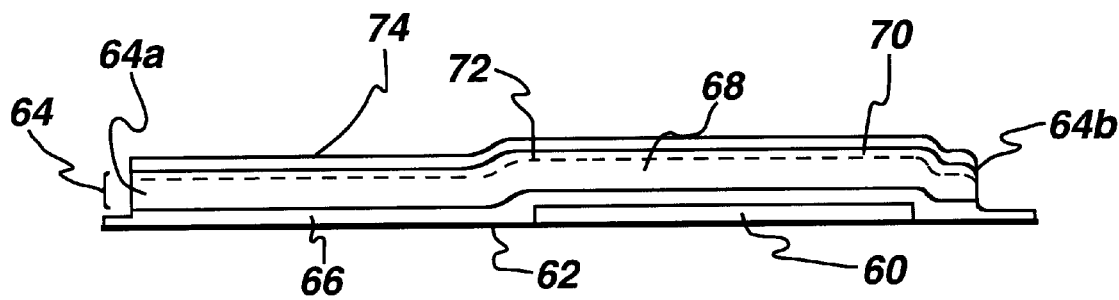

FIG. 4(a) illustrates the gate electrode 60 as being laid over by a field effect transistor (FET) island 64; FIG. 4(b) is a cross-sectional view taken the line 4(b)—4(b) of FIG. 4(a).

FIG. 4(b) illustrates the formation of the dielectric layer 66 so as to cover at least the gate electrode 60. The dielectric layer 66 is selected from the group of materials comprising SiOx and SiNx that has a typical thickness such as that previously described for the dielectric layer 30 of FIG. 2(b). FIG. 4(b) further illustrates the formation of a substantially intrinsic amorphous silicon (i-Si)layer 68 over the dielectric layer 66. The (i-Si)-layer 68 is overlayed by a n+ type doped (n+-Si) layer 70 having a bottom boundary 72 indicated in phantom. As seen in FIG. 4(b), the FET island 64 includes elements 68, 70 and bottom boundary 72. The FET island 64 has first and second ends 64A and 64B respectively. The i-Si layer 68 is about 0.1 to 0.5 μm in thickness and the n+-Si layer 70 is about 20 to 100 nm in thickness.

FIG. 4(b) further illustrates the deposition of a first conductive layer 74 of molybdenum over the FET island 64. The molybdenum layer 74 serves as the base of the data line and has a thickness in the range of about 0.02 to about 0.1 microns. The molybdenum layer 74 also serves as a protective layer to minimize interaction of the aluminum with the underlying silicon. It is desirable that the molybdenum layer 74 be completely inside the ends 64A and 64B of the FET island 64 so as to minimize the chances of shorts in this region where the data line may cross, for example, over a scan (gate electrode 60) line, which can result if the moly (Mo) is wet etched a sufficiently long time before the silicon is etched. The silicon typically is etched by reactive ion etching (RIE) in a plasma containing Cl, F, or a halogen combination.

Figure 5A:
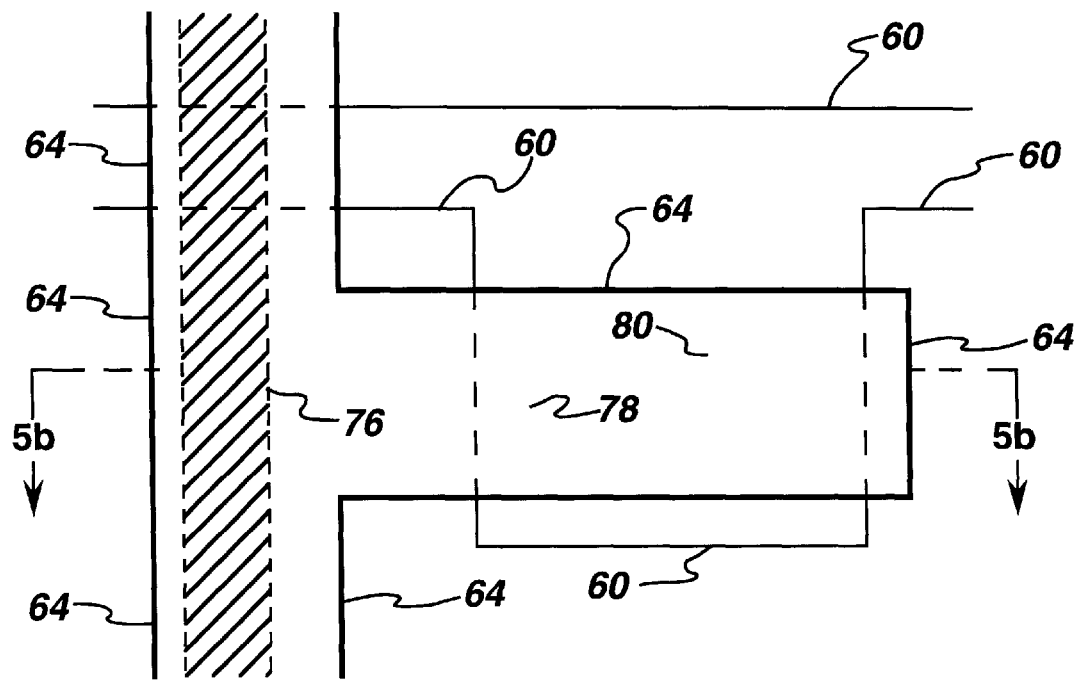

FIG. 5(a) illustrates a data line 76 formed of aluminum and having a thickness of about 0.5 to about 1.0 microns that is deposited on the FET island 64. It should be noted that the layer of aluminum is placed over the layer of molybdenum without the need for forming contact holes for the aluminum. This eliminates a prior art step that required holes to be formed into insulating material. The forming of the aluminum layer is most clearly shown in FIG. 5(b) which is a cross-sectional view taken along line 5(b)—5(b) of FIG. 5(a).

Figure 5B:
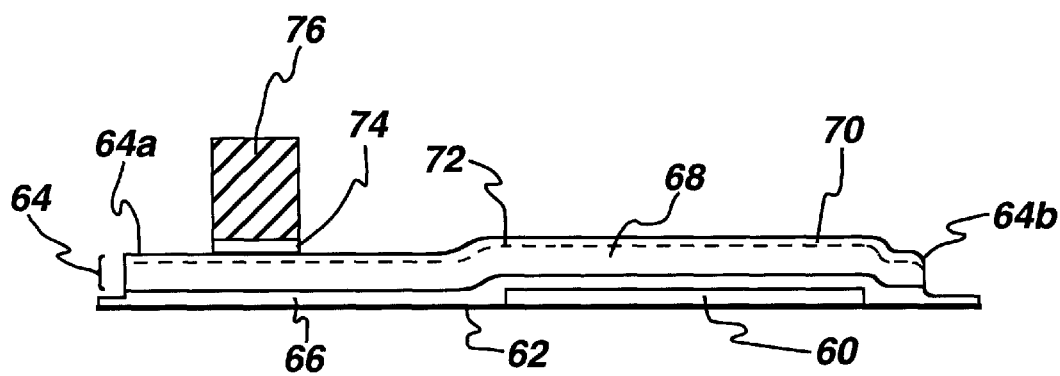

FIG. 5(b) shows the molybdenum layer 74 as only remaining under the layer of aluminum 76. The molybdenum layer 74 is removed from the amorphous silicon layer 68 except for the region under aluminum layer 76. The removal is preferably accomplished by an etch accomplished by wet etching using a phosphoric acid and nitric acid mixture, such as that made available from Cyantek, Inc., and carrying their tradename "Cyantek-12S." The wet etching is accomplished at an elevated temperature in the range from about 40° C. to about 60° C. so that the aluminum and the underlying molybdenum etch at substantially the same rate. In this manner, the molybdenum layer 74 does not undercut the aluminum layer 76 thereby preventing a sidewall profile that would be difficult to seal with subsequent layers, such as the passivation layer 36 of FIG. 2(c). At this point the FET digdown via 28 of FIG. 1 is commonly formed in the contact region and the source-drain electrode is deposited and patterned and is further described with reference to FIG. 6.

Figure 6A:
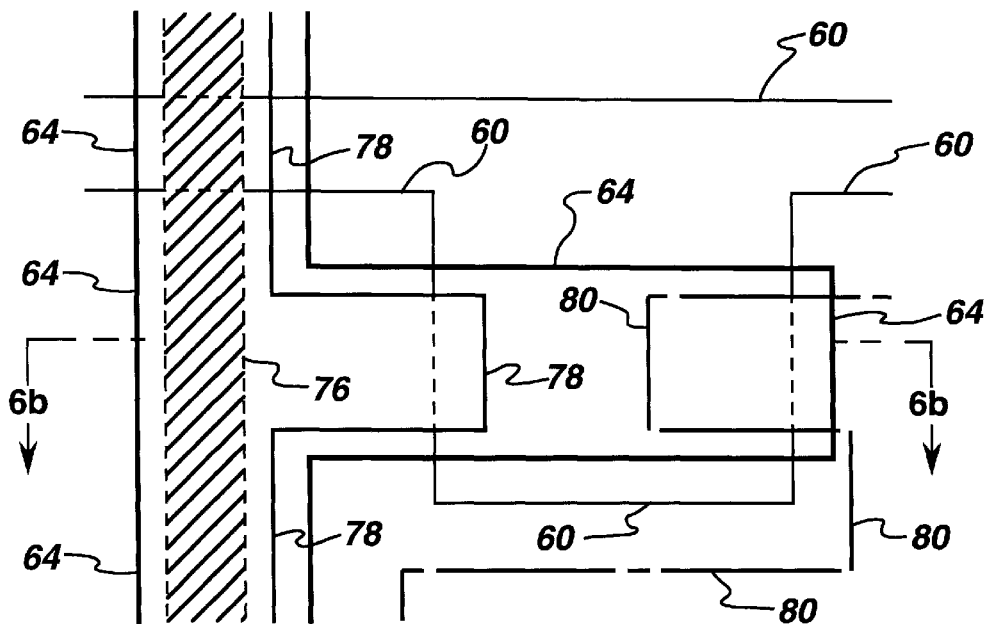

FIG. 6(a) illustrates a structure in the array comprised of the gate electrode 60, the FET island 64, and a source-drain metal electrode with first and second portions 78 and 80. The aluminum layer 76 is shown in phantom because it is under the first portion 78 of the source-drain metal electrode. The first and second portions of the source-drain metal electrodes 78 and 80, respectively, may be further described with reference to FIG. 6(b) which is a cross-sectional view taken along line 6(b)—6(b) of FIG. 6(a).

Figure 6B:
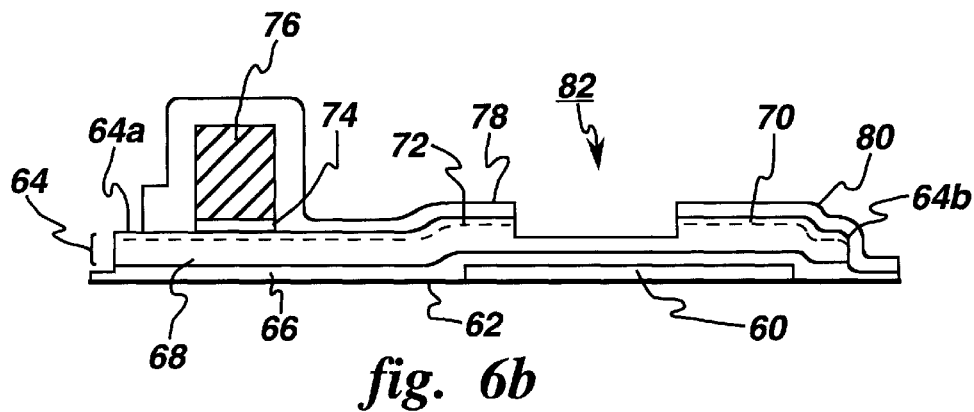

The source-drain metal electrode portion 78 of FIG. 6(b) (same as layer 20 of FIG. 2) is preferably comprised of a second layer of molybdenum that is deposited so as to completely cover the layer of aluminum 76 and some of the FET island 64 at the first opposite end 64A adjacent the layer 76 of the aluminum. The first portion 78, as well as the second portion 80, has a thickness of about 0.2 μm to about 0.5 μm. This first and second portions 78 and 80 may be etched in a manner as discussed for layer 20 of FIG. 2.

FIG. 6(b) further illustrates that the second portion 80 of source-drain metal electrode covers at least the second end portion 64B of the FET island 64 where it extends to form the bottom contact of the photodiode. Because of the aluminum layer 76, a center layer of source-drain metal electrode having portions 78 and 80 with a thickness toward about 0.2 μm, can be used, which improves the patterning of the back channel region 82 to be described with reference to FIG. 6(c).

Figure 6C:
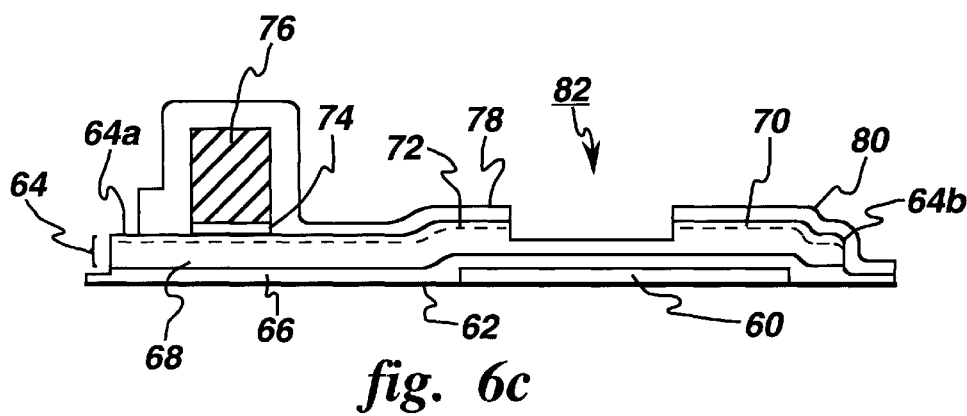

The FET island 64 is further subjected to a process of etching n+-Si usually by RIE in a plasma containing Cl, F, or a combination of halogens, from the top layer 70 to form the back channel 82 of the thin field transistor. The first and second portions 78 and 80 of the source-drain metal electrode are formed with a gap between them which helps define the back channel 82 of the TFT. The source-drain metal electrode layer 80 and may be further described with reference to FIG. 6(c). The etching is accomplished in the region separating the first (78) and second (80) portions of source-drain metal electrode so as to provide an electrically isolated path therebetween which n+-Si, being conductive, would otherwise short. As seen in FIG. 6(c), the top layer 70 is removed from the region between the first (78) and second (80) portions of source-drain electrodes and, furthermore, the removal extends to below the boundary line 72 of the layer 70. The etching is then covered with a dielectric (not shown) typically selected from the group comprising SiOx and SiNx.

The process illustrated in FIGS. 3–6 differs from the prior art in that the molybdenum layer 74 is removed from the channel region 82 of the thin film transistor (TFT). However, this removal of Mo does not degrade the operation of the thin film transistor because, by using wet strips of photoresist during patterning of the FET island 64, such as that shown in FIG. 5(a), and also during patterning of the digdown vias 28 of FIG. 2(c), the contact resistance of the n+ Si is not degraded by being disadvantageously exposed to $O_2$ plasma (an alternate method to remove photoresist). The use of wet strips allows the contact resistance to the TFT to be unaffected by the practice of the present invention. The wet stripping can be done using, for example, PRS series resist strippers, available from J. T. Baker Company, at a temperature in the range between about 80° to about 90° C.

The advantage of the present invention is to incorporate an aluminum data line into the process for forming imagers with the addition of only one deposition step of aluminum and only one photomask step of patterning aluminum. Generally, two depositions and two photomasks steps are required, one for an insulating dielectric layer in which contact holes for the aluminum are formed, and a second set of steps for the aluminum. Further, by overlaying the aluminum layer 76 completely with the molybdenum layer 78, the aluminum is encapsulated so that its shape is fixed and so that the grain boundary mobility will not lead to shorts or other defects previously discussed. Additionally, the process of FIGS. 3–6 substantially reduces the risk of corrosion to the overlaying layers or changes in the etch rate of the quality of subsequent steps, e.g., etch rate changes may undesirably be altered due to the presence of aluminum. The risk of Al affecting the n+ Si removal by RIE is reduced because the Al is not exposed during the n+ Si removal of FIG. 6(c). More particularly, the aluminum is encapsulated during the n+-Si removal.

Another aspect of the process of FIGS. 3–6 is that the aluminum data line 76 is narrower than prior art data lines such as that could be established by the FET island 64 because of the extension of FET island 64 past the edges of aluminum layer 76, but the higher conductivity of Al compared to other useful metals like, molybdenum, more than compensates for this narrowing in lowering the data line resistance.

If desired, the aluminum data line illustrated in FIG. 5(b) could be a two layer structure of aluminum with a thin layer (e.g., about 20 nm to about 50 nm) of molybdenum on top of layer 76. In such an arrangement, the molybdenum would tend to suppress aluminum hillock formations especially if it is deposited in the same vacuum pumpdown as that typically occurring during aluminum deposition.

It should now be appreciated that the practice of the present invention provides for data lines comprising a layer of aluminum which reduces the electrical resistance of the data line, and because of the practice of the present invention, the aluminum is encapsulated by a molybdenum metal, such as layer 78, and the layer 76 of aluminum does not manifest hillock growth once the layer 78 has been formed thereto.

Figure 7:
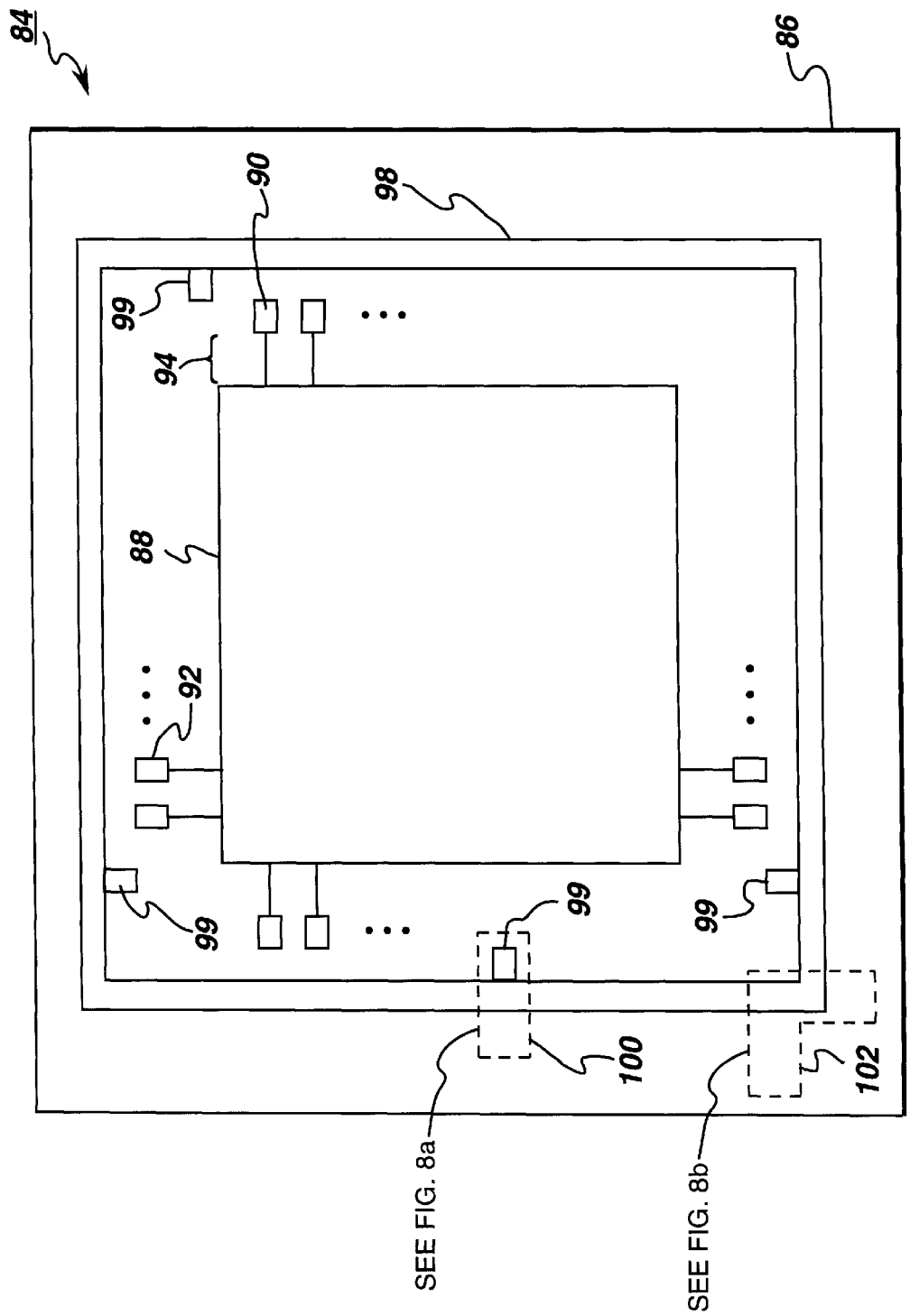
FIG. 7 is a schematic of an imager related to the present invention.

All of the inventive features hereinbefore described with reference to FIGS. 1–6 are well adapted for use in a further embodiment of an imager 84 as illustrated in FIG. 7. The imager 84 is typically formed on a substantially flat substrate 86, typically glass. The imager 84 comprises an array 88 of pixels with photosensitive elements, preferably photodiodes, each of which has an associated switching element, preferably a TFT. Both devices (photodiodes and TFT) preferably comprise a-Si. This light sensitive region of the array is typically referred to as the active region of the array. The array 88 is addressed around its perimeter by a plurality of row and column address lines having contact pads 90 and 92 which extend along the array 88 as indicated by the dot representations of FIG. 7.

In operation, the voltage on the row lines, and hence the TFTs, are switched on in turn, allowing the charge on that scanned line's photodiodes to be read out via the column address lines. The row address lines are commonly called the scan lines and the column address lines the data lines. The data lines may be those yielded by the practice of the invention related to FIGS. 3–6. The address line thus are disposed in an active region of the pixel array 88, with contact finger 94 extending from the active region towards the edge of the substrate. The contact finger 94, previously discussed with reference to FIG. 1, electrically connects to contact pads, such as row contact pads 90 and column contact pads 92, which, in turn, can be electrically connected to an external device 13 of FIG. 1. As more fully discussed in U.S. Pat. No. 5,389,775 issued Feb. 14, 1995 of Kwasnick et al, the contact pads, such as 90 and 92, include contact pads connected to the common electrode of the array.

Outside the contact pads, such as contact pad 90, a guard ring 98 is typically disposed around the perimeter of the pixel array. Ground ring 98 is typically maintained at ground potential during operation and serves the purpose of protecting the array from electrostatic discharge during the formation of the imager, and during connection of the imager to external circuitry, and acts as a ground potential for the imager 88. The guard ring 98 has one or more guard contact pads 99 spaced apart from each other around the inner side of the perimeter of the guard ring 98 as shown in FIG. 7. The guard ring 98 preferably forms a boundary region serving as a perimeter in the region more distant from the array 88 than the contact pads 99 and with at least one corner in the perimeter.

The imager guard ring 98, without the benefits of the present invention, suffers from similar corrosion protection considerations as the contact pad previously described with reference to FIGS. 1 and 2. That is, for best electrostatic discharge protection conducting material from the guard ring 98 is exposed to ambient after ITO formation, but the structure should be made resistant to corrosion to avoid imager degradation. A primary feature of the present invention is that electrical contact is not directly made to the guard ring 98 but instead to contact pads 99 connected to the guard ring 98. The guard ring 98 may be further described with reference to FIG. 8 composed of FIGS. 8(a) and 8(b) which are plan views of the guard ring 98 regions 100 and 102, respectively, shown in FIG. 7, and wherein region 100 is shown as having a guard ring contact pad 99 within its boundaries, and region 102 is shown as preferably having an L shape.

Figure 8A:
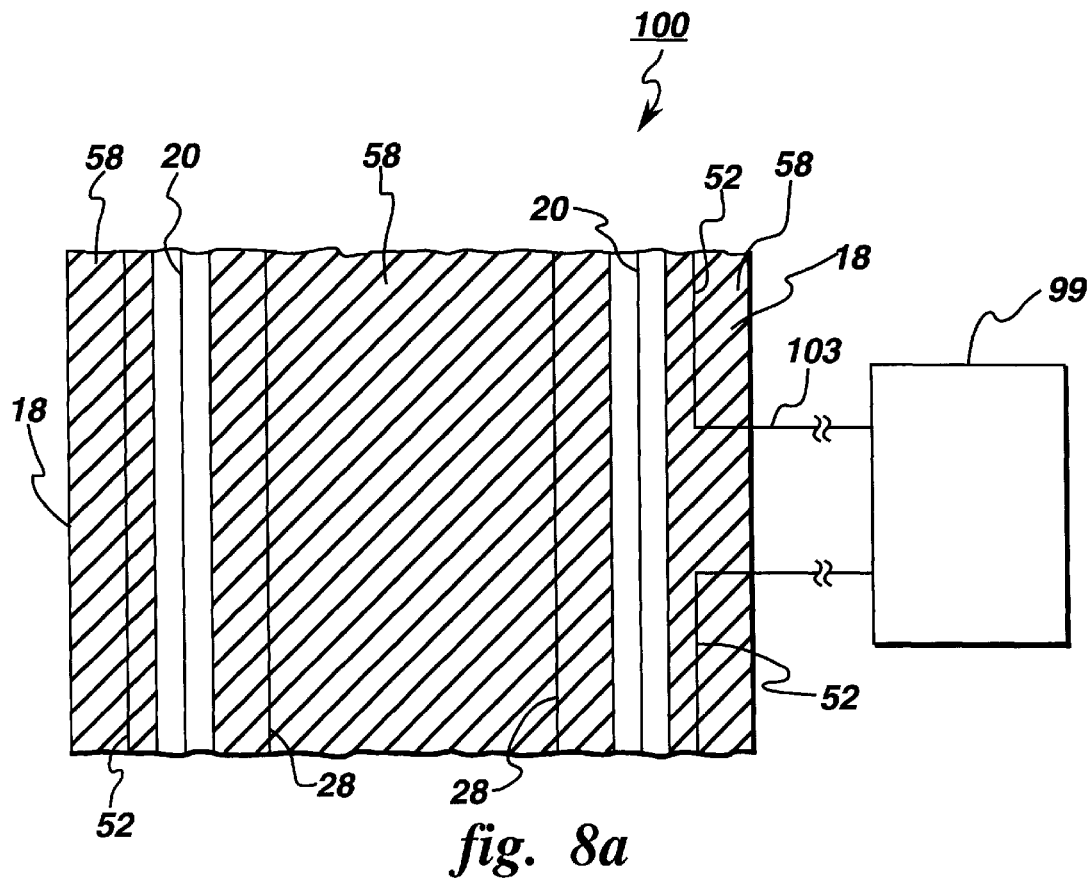
FIGS. 8a and 8b are plan views of ground ring regions related to the present invention.

FIG. 8(a) shows in cross hatch the barrier layer 58, exposing some of the ITO layer 52, all previously discussed with reference to FIG. 2, on both sides of the ground ring 98. FIG. 8(a) further illustrates the ITO layer 52 as having an extension portion 103 free of the barrier layer 58 and that extends to the right (as viewed in FIG. 8(a)) and that is interconnected to a guard contact pad 99 (also shown in FIG. 7). To minimize the change of bias-enhanced corrosion, guard contact pads 99 are kept removed from regions 102 where ITO layer 52 makes contact to underlying conductive materials and is thus more susceptible to electrochemically-induced corrosion. Further, the extension portion 103 is not placed in the second region 102 but rather is preferably located away from the second region 102 by a distance of at least 1 cm.

Figure 8B:
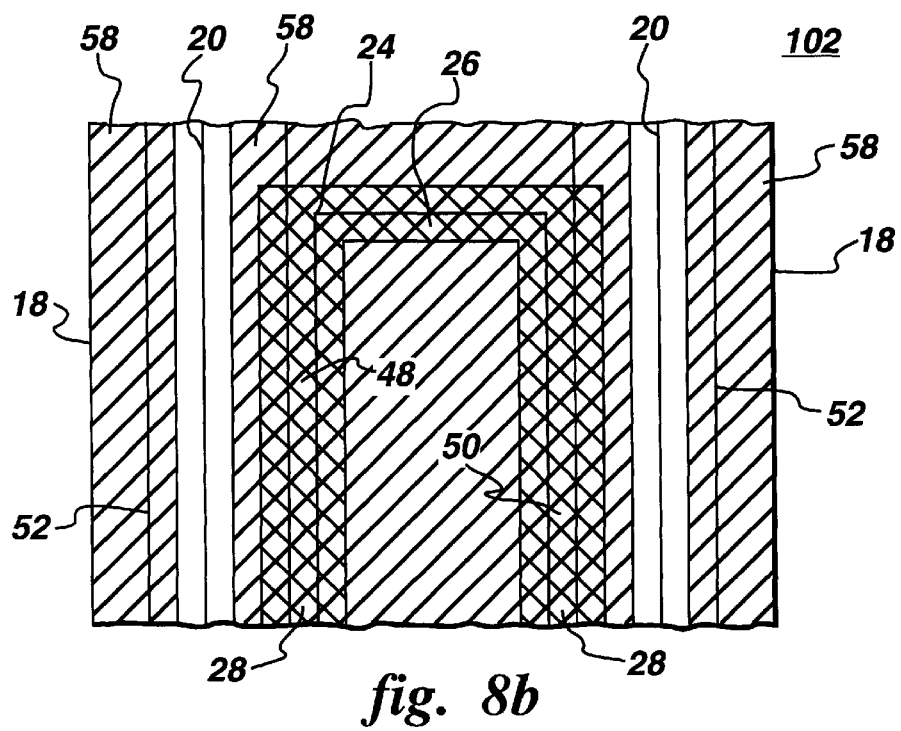

FIG. 8(b) shows in cross hatch the barrier layer 58, and preimidized polyimide portions 48 and 50 cross hatched in the opposite direction to barrier layer 58. Region 102 of FIG. 8(b) differs from region 100 of FIG. 8(a) in having the polyimide annulus 26 and diode digdown via 24; preimidized polyimide portions 48 and 50 are part of the polyimide annulus 26. The portion 26 of FIG. 8(b) is shown for the upper portion thereof, but in actuality portion 26 preferably extends down to the corner of the guard ring 98 as generally by the L-shape illustrated in FIG. 7 for region 102. Although it is preferred, region 102 need not extend into the corner of the guard ring 98. More particularly, in order to minimize corrosion of region 102 associated with the potential difference between ground ring 98 and contact pads 90 and 92 running along a substantial portion of each side of the array 88, region 102 is preferably confined within about 1 mm to about 1 cm of a corner of the guard ring 98.

The process steps related to regions 100 (FIG. 8(a)) and 102 (FIG. 8(b)) may be further described with reference to FIGS. 9 and 10, respectively, which illustrate the process after the related step is performed. FIG. 9 is composed of FIGS. 9(a), 9(b), 9(c), 9(d), 9(e), 9(f) and 9(g) respectively similar to FIGS. 2(a), 2(b), 2(c), 2(d), 2(e), 2(f) and 2(g) and illustrating the same reference numbers thereof. Similarly, FIG. 10 is composed of FIGS. 10(a), 10(b), 10(c), 10(d), 10(e), 10(f) and 10(g) respectively similar to FIGS. 2(a), 2(b), 2(c), 2(d), 2(e), 2(f) and 2(g) and illustrating the same reference numbers thereof.

In general, FIGS. 9(a) and 10(a) illustrate the formation of the gate contact region 18 for regions 100 and 102 respectively. FIGS. 9(b) and 10(b) illustrate the formation of the source-drain contact region 20 for regions 100 and 102 respectively and also illustrate the formation of edge portions 32 and 34 of the dielectric layer 30. FIGS. 9(c) and 10(c) illustrate the deposition of the TFT passivation dielectric layer 36 for regions 100 and 102 respectively associated with the formation of the photodetector diode of the array 88 of FIG. 7. FIGS. 9(d) and 10(d) illustrate the formation of the diode passivation bottom layer 38 for regions 100 and 102. FIG. 10(e) illustrates the formation of the preimidized polyimide portions 48 and 50 of region 102 having sloped sidewalls 48A and 48B; and 50A and 50B respectively. FIGS. 9(f) and 10(f) illustrate the formation of the ITO layer 52 for regions 100 and 102 serving as a common electrode for the array 88 of FIG. 7. It should be noted that the ITO layer 52 has an extension 103 previously described with reference to FIG. 8(a). FIGS. 9(g) and 10(g) illustrate the formation of the barrier layer 58 for regions 100 and 102. FIGS. 9 (g) and 10(g) differ from FIG. 2(g) in that the barrier layer 58 shown in FIGS. 9(g) and 10(g) is placed onto the ITO layer 52 so as to leave exposed regions 54 and 56 thereof. The performance of the guard ring 98 is enhanced by having these regions 54 and 56 exposed to ambient.

It should now be appreciated that the present invention provides a guard ring 98 having guard ring contact pads 99 all generally illustrated in FIG. 7 and has the regions 100 and 102 particularly illustrated in FIG. 8(a) and 9 and 8(b) and 10, respectively, in which electrical contact for the guard ring 98 is not made directly thereto, but instead to the guard ring contact pads 99 connected to the guard ring 98, thereby, safeguarding the guard ring 98 from the detrimental effects caused by humidity.

Figure 11:
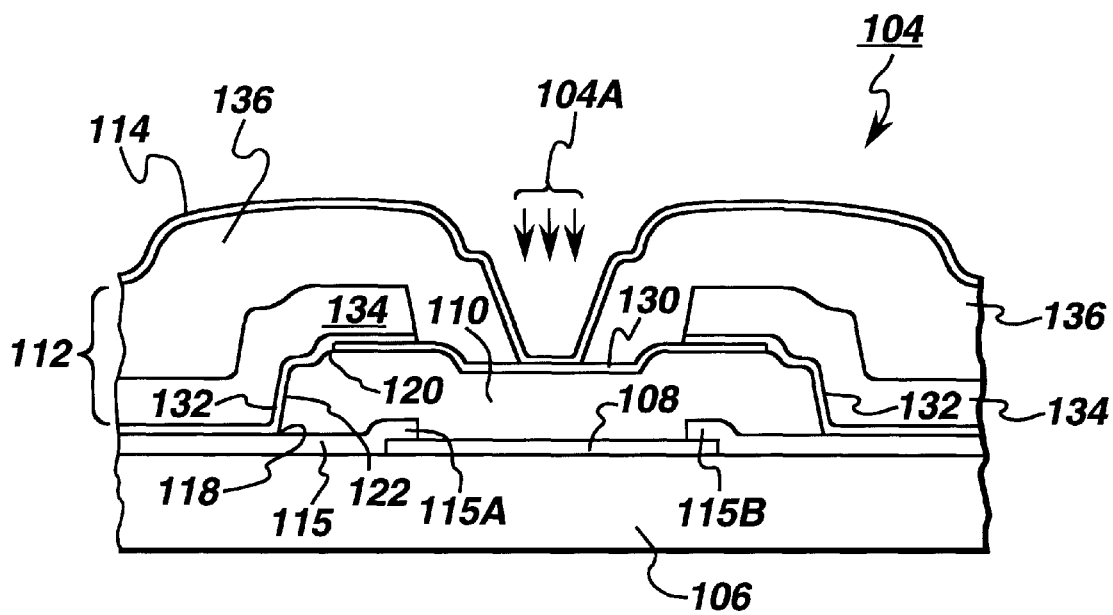
FIGS. 11 and 12 are cross-sectional views of a photodiode in accordance with one of the exemplary embodiments of this invention.

A still further embodiment of the present invention is illustrated in FIG. 11. A photosensor element such as a photodiode 104 in accordance with this invention comprises a substrate 106, a bottom contact pad 108, a photosensor island 110, a multitier passivation layer 112, a top contact layer 114 and a FET passivation layer 115 having end portions 115A and 115B that overlap the bottom contact pad 108 in a manner similar to portions 32 and 34 of layer 30 overlapping the gate contact region 18 of FIG. 2. In operation, photodiode 104 is exposed to actinic incident radiation 104A which generates mobile charge in the body of the photodiode 104. In a common arrangement, photodiode 104 is one of a number of photodiodes in a photosensitive array 116 in rows and columns on substrate 106 (see FIG. 13). For ease of describing the invention, other elements that may be formed on substrate 106 along with the photodiode 104, such as address lines (commonly in a matrix of scan and data lines) and TFTs to control switching on these lines between photodiodes are not shown in FIGS. 11–13, but may be the type previously described with reference to FIG. 7. Alternatively, many photodiodes may be formed on substrate 106 and electrically connected to switches and other processing circuits located off the substrate 106, or to diode switches in each pixel.

Photosensor island 110 comprises light absorptive semiconductive material such as a-Si, and may comprise layers (not shown) of silicon doped of a selected conductivity (i.e., n-type or p-type) to provide the desired diode electrical properties and respective electrical contact to bottom contact pad 108 and top contact layer 114. Amorphous silicon and related materials are typically deposited by plasma enhanced chemical vapor deposition (PECVD) or similar methods and then patterned, for example by etching, to form the desired island structure on substrate 106. Photosensor island 110 is disposed between top contact layer 114 and bottom contact pad 108 such that a selected bias voltage is applied across the photosensor body; photosensor island 110 is typically mesa-shaped, having sidewalls extending upwardly and inwardly from a base 118 of photosensor island 110 towards an upper surface 120 disposed between sidewalls 122. Top contact layer 114 comprises a substantially transparent conductive material such as indium tin oxide (ITO) (previously described with reference to FIGS. 1 and 2) or the like.

Bottom contact pad 108 and top contact layer 114 serve as the electrodes in the photodiode to establish the electric field across the device (to allow the aforementioned charge to be collected). Charge generated in the photodiode as a result of the absorption of optical photons in the semiconductive material is collected at a selected electrode that is periodically "read" or measured, or equivalently, decreases the applied bias between bottom contact pad 108 and top contact layer 114 at which time the bias voltage across the photodiode is reset to its selected value.

Bottom contact pad 108 is typically disposed on substrate 106 and typically comprises an electrically conductive material that has good electrical contact with the material of photosensor island 110. Alternatively, bottom contact pad 108 may be disposed on a dielectric layer or on other materials (not shown) disposed on the substrate 106. Typical materials from which bottom contact pad 108 is formed include molybdenum or chromium with thickness of about 0.1 to about 1.0 microns. Bottom contact pad 108 is connected to switching and processing circuits, which are not illustrated in FIGS. 11–13, that allow the charge generated by the photodiode in response to incident radiation to be measured.

Photodiode 104 with thickness of 0.5 to 2.0 microns or more typically comprises the multitier passivation layer 112 disposed under top contact layer 114 except at regions as shown in FIG. 11 where the top contact layer 114 is disposed in electrical contact with an underlying and preferred (but not required) ITO strap 130 of photosensor island 110. In accordance with an embodiment of this invention, multitier passivation layer 112 comprises a first tier inorganic dielectric layer 132 which makes a good quality bond with ITO strap 130, a second tier inorganic moisture barrier layer 134, and a third tier organic dielectric layer 136. Inorganic dielectric layer 132 extends at least over sidewalls 122 of photosensor island 110, typically extends beyond sidewalls 122 at the base 118 of photosensor island 110, and typically additionally extends over at least a portion of upper surface 120, as illustrated in FIG. 11. For the embodiment of the invention devoid of the ITO strap 130, the first tier inorganic dielectric layer 132 may be removed so that the multitier passivation layer 112 comprises the second and third tier layers 134 and 136 respectively.

Figure 12:
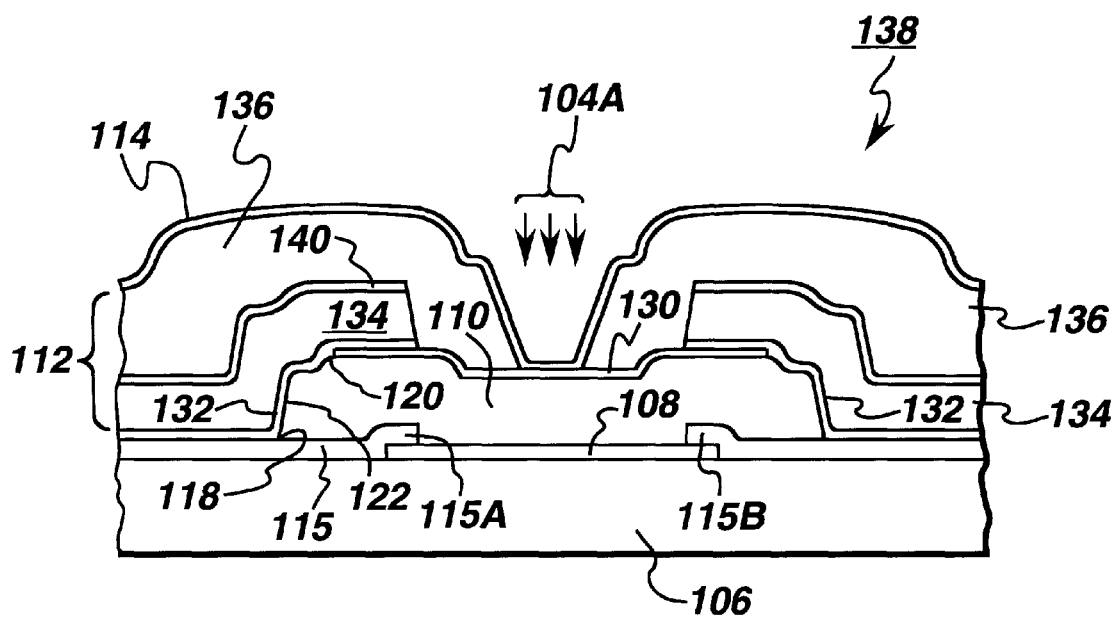
Figure 13:
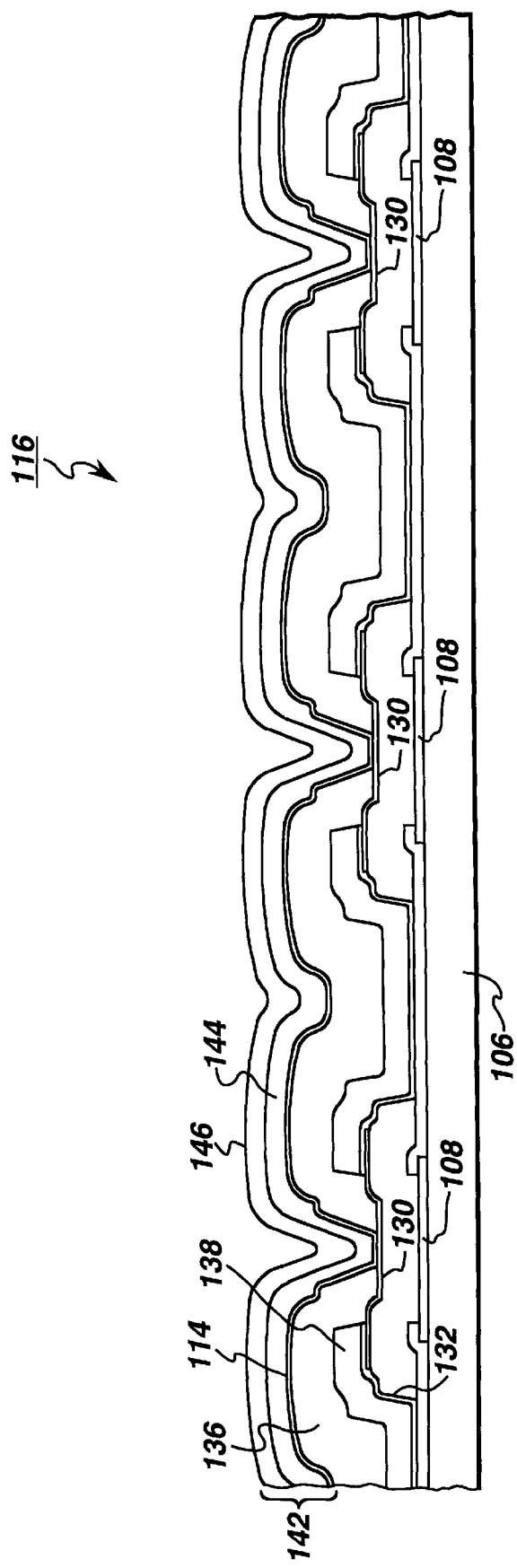
FIG. 13 is an illustration of a representative multitier passivation layer in a photosensor array completed in accordance with this invention.

The multitier layer 112 of FIGS. 11–13 has many of the characteristics of the passivation layer 38 of FIGS. 1 and 2. First tier inorganic barrier layer 132 of the multitier layer 112 comprises silicon oxide and has a typical thickness in a range between about 0.005 microns and 0.05 microns. The silicon oxide comprising first tier inorganic barrier layer 132 is typically deposited in a plasma enhanced chemical vapor deposition (PECVD) process. Silicon oxide deposited in this process provides improved adhesion relative to SiNx and conforms well to the underlying sidewalls 122. Enhanced adhesion between inorganic barrier layer 132 and the under lying and preferred ITO strap 130 on upper surface 120 provides improved dimensional control of the via necessarily formed in this dielectric so that the photodiode top may be contacted. Additionally, the silicon oxide provides a robust moisture barrier and is resistant to solvents, such as gamma butyrolactone, which may be present in the array from the deposition of polyimide.

The second tier inorganic moisture barrier layer 134 comprises silicon nitride having a thickness in a range between about 0.5 microns and 1.5 microns. The silicon nitride comprising the second tier inorganic dielectric barrier layer 134 is typically deposited on first tier inorganic dielectric layer 132 in the same PECVD process. The second tier inorganic dielectric layer 134 forms a barrier layer having a low pinhole density and is relatively thick so that it is highly resistant to penetration by moisture; the SiNx is further readily disposed by PECVD so as to conform to the topography of the diode sidewall 122 and thus acts as a good moisture barrier. This protection is of particular importance on sidewalls 122, which otherwise present relatively large surfaces that are subject to degradation from exposure to moisture over time and can become the source of considerable charge leakage from the device.

In an alternative embodiment of this invention illustrated in FIG. 12, a photodiode 138 comprises a multitier passivation layer 112 having a fourth tier inorganic dielectric layer 140 sandwiched between the second (134) and third (136) tiers. Fourth tier inorganic dielectric layer 140 comprises silicon oxide. Such a layer typically has a thickness in a range between about 0.005 microns and about 0.05 microns; except as noted herein, the device of the alternative embodiment is otherwise the same as that described elsewhere in the specification with respect to the multitier passivation layer comprising at least two inorganic dielectric layers. It has been noted that SiOx provides improved adhesion to ITO relative to SiNx, and photoresist has improved adhesion to SiOx relative to SiNx. Thus, during etching of the photodiode top contact via, dimensional control is very good.

Third tier organic dielectric layer 136 is disposed over substrate 106 and inorganic barrier layers 132, 134 and 140. More particularly, with reference to FIG. 12, third tier dielectric layer 136 is disposed over fourth dielectric layer 140, and with reference to FIG. 11, third tier dielectric layer 136 is disposed over second tier dielectric layer 134. Dielectric layer 136 is disposed in a way so that it overlaps and seals the edges of the multitier passivation layer 112 in such a manner that top contact layer 114 makes good electrical contact with the ITO strap 130. The dielectric layer 136 has a shape similar to the preimidized polyimide portions 48 and 50 having sloped sidewalls 48a and 48b; and 50a and 50b (shown in FIG. 2(e)) so as to define good electrical contact between the top contact layer 114 and ITO strap 130 in a manner similar to that previously described with reference to FIG. 2(f). Organic dielectric layer 136 typically comprises a polyimide and has a typical thickness in a range between about 1.0 microns and about 2.0 microns deposited by a spin or a meniscus coating process. It is desirable that the top surface of organic dielectric layer 136 be reasonably smooth so that top contact layer 114 deposited thereover will be of high integrity. Dielectric layer 136 is thermally stable, that is, the polyimide structure does not undergo chemical decomposition or excessive swelling or shrinking that would cause cracks or lifting of the layer 136 resulting in the layer 136 losing its dielectric properties or breaking the structural integrity of the layer 136.

Top contact layer 114 is disposed over organic dielectric layer 136 and is in electrical contact with photosensor island 110 at contact area 130 for both of the embodiments of FIGS. 11 and 12. Top contact layer 114 comprises a substantially transparent electrically conductive material such as indium tin oxide (ITO), and forms the electrical contact between the photodiode and other elements used in reading and processing the charge generated by the photodiode in response to incident radiation. Thus, in the finished device, multitier passivation layer 112 is disposed between top contact layer 114 and photosensitive island 110 or substrate 106, except in contact area 130 on top surface 120 of photosensor island 110.

In operation, for both embodiments of FIGS. 11 and 12, actinic incident radiation 104 enters photosensor island 110 after passing through one or all of the following: substantially optically transparent top contact layer 114, organic dielectric layer 136, inorganic moisture barrier layer 134, and inorganic dielectric layer 132. Radiation absorbed by the a-Si in the photosensor island 110 results in the generation of charge, which is collected at the contacts 108 and 130. The multitier passivation layer 112, in accordance with this invention, minimizes sidewall leakage from the photodiode 104. The inorganic dielectric layer 132 adjoins the sidewalls 122 and provides improved adhesion relative to SiNx to the underlying ITO strap 130 on the diode surface. The second tier inorganic moisture barrier layer 134 is disposed on the first tier inorganic dielectric layer 132 to limit moisture penetration to sidewalls 122. The second tier SiNx layer 134 serves as the most significant moisture resistant layer because it has excellent step coverage, is inorganic, is relatively thick, and has reasonably low pinhole and crack formation characteristics. The multitier passivation layer 112 further protects the a-Si photosensor island 110 from leakage resulting from the combination of moisture introduced from the ambient into the polyimide and ionic impurities present in most polyimides, while still enabling the use of polyimide to take advantage of its numerous attributes, such as the ability to deposit it in a relatively thick amount without resulting cracks and stresses in the. Furthermore, the multitier passivation layer 112 forms steps for highly reliable continuity for top contact layer 114 over edges of the organic dielectric layer 136.

The advantages of this invention are especially applicable to all photosensitive elements in which sidewall leakage is of concern to device performance. Sidewall leakage is of particular importance as photodiode sizes decrease to less than 1 mm, since sidewall leakage then becomes a significant contributor to the total reverse bias leakage of the photodiode. Particularly for photodiodes having a size of less than about 200 microns on a side, sidewall leakage dominates the area leakage component and is thus of primary importance to this aspect of device performance. The multitier passivation layer 112 provided by this invention similarly benefits larger photodiodes in which humidity related degradation of sidewalls can cause sidewall leakage to become a significant leakage contributor.

Subsequent to deposition of the multitier passivation layer 112, fabrication of photosensitive array 116 of FIG. 13 is continued with deposition of a photosensitive array barrier layer 142. The barrier layer 142 typically includes two strata; the first stratum, silicon oxide 144 having a thickness of about 0.01 to about 0.1 microns, is disposed over top contact layer 114 of the photosensor array, and the second stratum 146, silicon nitride having a thickness of about 0.5 to about 2.0 microns, is disposed over the first stratum 144. Further details relating to passivation layer may be found in U.S. Pat. No. 5,187,369 issued to J. D. Kingsley et al., assigned to the assignee herein.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of forming a data line for a pixel array, the method comprising the steps of:

(a) forming a gate electrode on a substrate;

(b) depositing a first dielectric layer so as to at least completely cover said gate electrode;

(c) forming a layer of amorphous silicon over said dielectric layer, said layer of amorphous silicon having first and second opposite side portions;

(d) forming a first layer of molybdenum over said amorphous silicon;

(e) forming a layer of aluminum disposed in electrical contact with a portion of said first layer of molybdenum without the need of forming contact holes for said aluminum;

(f) removing said first layer of molybdenum except for the portions of said first molybdenum layer disposed under said layer of aluminum; and (g) forming a second layer of molybdenum, said second layer of molybdenum having respective first and second portions with said first portion being disposed so as to completely cover said layer of aluminum and some of said amorphous silicon at said first opposite side portion thereof, and with the second portion covering said second opposite side portion of said amorphous silicon, said first and second portions of said second layer of molybdenum being spaced apart from each other to form a gap.

2. The method according to claim 1, wherein said amorphous silicon has a top layer of n+-Si and said method comprises the steps of:

(a) etching n+-Si from the top of said amorphous silicon not covered by either of said first and second portion of said second layer of molybdenum; and (b) forming a layer of dielectric over said etched n+-Si.

3. The method according to claim 2, wherein said aluminum layer has a thickness in the range between about 0.5 $\mu$m and about 1.10 $\mu$m.

4. The method according to claim 1, wherein the removing step (f) comprises the step of wet etching with a wet etch comprising phosphoric acid and nitric acid at an elevated temperature so that said molybdenum and aluminum etch at about the same rate.

5. The method according to step 4, wherein said elevated temperature is in the range between about 40° C. and about 60° C.

6. The method according to claim 1, wherein said second layer of molybdenum has a thickness in the range between about 0.1 $\mu$m and about 0.5 $\mu$m.

7. The method according to claim 1, wherein said first layer of molybdenum has a thickness in the range between about 20 nm and about 50 nm.

* * * * *